US008546188B2

(12) United States Patent
Liu et al.

(10) Patent No.: US 8,546,188 B2
(45) Date of Patent: Oct. 1, 2013

(54) BOW-BALANCED 3D CHIP STACKING

(75) Inventors: Fei Liu, Mt. Kisco, NY (US); Albert M. Young, Fishkill, NY (US); Roy R. Yu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 255 days.

(21) Appl. No.: 12/757,511

(22) Filed: Apr. 9, 2010

(65) Prior Publication Data

US 2011/0248396 A1 Oct. 13, 2011

(51) Int. Cl.
*H01L 21/00* (2006.01)
*H01L 23/02* (2006.01)

(52) U.S. Cl.
USPC .... 438/109; 438/455; 257/686; 257/E21.614; 257/E21.567

(58) Field of Classification Search
USPC .................................................. 257/E21.614
See application file for complete search history.

(56) References Cited

U.S. PATENT DOCUMENTS

| | | | | | |
|---|---|---|---|---|---|
| 4,939,568 | A | * | 7/1990 | Kato et al. | 257/686 |
| 6,962,835 | B2 | * | 11/2005 | Tong et al. | 438/108 |
| 2005/0224921 | A1 | * | 10/2005 | Gupta et al. | 257/621 |
| 2006/0121690 | A1 | * | 6/2006 | Pogge et al. | 438/455 |
| 2007/0057384 | A1 | * | 3/2007 | Alam et al. | 257/783 |
| 2007/0120241 | A1 | * | 5/2007 | Trezza et al. | 257/686 |
| 2008/0163139 | A1 | | 7/2008 | Schefer et al. | |
| 2009/0001598 | A1 | * | 1/2009 | Chiou et al. | 257/777 |
| 2010/0007001 | A1 | * | 1/2010 | Wang et al. | 257/686 |

OTHER PUBLICATIONS

Topol, A.W. et al., "Three-Dimensional Integrated Circuits" IBM Journal of Journal of research and Development (2006) pp. 491-506, vol. 50(4/5).
Turner, K.T. et al., "Mechanics of Direct Wafer Bonding" Proceedings of the Royal Society A (2006) pp. 171-188, vol. 462.

* cited by examiner

*Primary Examiner* — Michelle Mandala
*Assistant Examiner* — Shaka White
(74) *Attorney, Agent, or Firm* — Scully, Scott, Murphy & Presser, P.C.; Louis J. Percello, Esq.

(57) ABSTRACT

A first set of semiconductor substrates includes semiconductor chips having bonding pads arranged in a primary pattern. A second set of semiconductor substrates includes semiconductor chips having bonding pads arranged in a mirror-image pattern. A first semiconductor substrate from the first set is bonded to a second semiconductor substrate from the second set such that each bonding pads is bonded to a mirror-image bonding pad. Additional substrates are bonded sequentially such that the bonded structure includes an even number of semiconductor substrates of which one half have bonding pads of the primary pattern and are bonded to the side of the first semiconductor substrate, while the other half have bonding pads of the mirror-image pattern and are bonded to the side of the second semiconductor substrate. The mirror-image patterns of the bonding pads enable maximal cancellation of wafer bow.

24 Claims, 12 Drawing Sheets

BOW-BALANCED 3D CHIP STACKING

BACKGROUND

The present invention relates to methods of forming a semiconductor structure, and particularly to methods of stacking semiconductor substrates while maximally compensating for bowing of the semiconductor substrates and a bonded assembly of a plurality of substrates thereby formed.

3D integration, or chip stacking, refers to a method of assembling two or more semiconductor chips so that the semiconductor chips that are placed in physical proximity to one another are also electrically connected among one another. 3D integration is typically performed vertically, i.e., one chip is placed above or below another chip. When two chips are brought together vertically, a set of conductive contact structures on the top surface of an underlying chip is aligned to another set of conductive contact structures on the bottom surface of an overlying chip. The conductive structures may be formed on the side of metal interconnect structures, or they may be formed on the side of a substrate on which semiconductor devices are formed.

Multiple semiconductor substrates can be vertically stacked in 3D integration. Currently, wafer-level 3D integration is demonstrated for 2-4 layer process in which each layer includes a single semiconductor substrate. Limiting factors in the increase in the number of layers in a three-dimensional integration ODD stack include bowing of the substrates at wafer bonding and non-uniformity of thickness within each substrate.

Specifically, there is a maximum bowing that can be accommodated during bonding of two substrates. If a holding wafer has intrinsic bow of I, and if the incremental wafer bow B is added after a top wafer is bonded and trimmed to the holding wafer, then a bonded structure that includes the holding wafer and 2N number of additional bonded wafers has a total wafer bow of $2N \times B + I$. Available instrumentation for bonding 300 mm wafers can handle wafers bow in the range from +300 microns (bowl-shaped bowing) to −100 microns (dome-shaped bowing). Typically, a wafer bow of a single wafer after front-end-of-line (FEOL) processes that form semiconductor devices and back-end-of-line (BEOL) processes that form metal interconnect structures ranges from +300 microns to −100 microns depending on technology. Thus, bonding even three wafers can be a challenge with current 3D integration technology.

While it is possible in theory to minimize the bow introduced by top wafer processing in FEOL and BEOL processing steps and bonding process steps, for example, by employing film compensation techniques, such processes are costly and time consuming. In practice, the change of wafer bow due to FEOL and BEOL processing steps and the bonding process steps is unavoidable due to process limitations. Because the total bow of bonded structures is cumulative, even a small change of wafer bow can result in a significant wafer bow when multiple wafers stacked. The wafer bow limits the maximum number of layer 3DI structures that can be stacked.

BRIEF SUMMARY

The present invention provides a method of vertically stacking multiple semiconductor substrates while maximally compensating the wafer bow in each of the semiconductor substrates. A first set of semiconductor substrates includes semiconductor chips having bonding pads arranged in a primary pattern. A second set of semiconductor substrates includes semiconductor chips having bonding pads arranged in a mirror-image pattern, which is the pattern of the mirror image of the primary pattern. A first semiconductor substrate from the first set is bonded to a second semiconductor substrate from the second set such that each bonding pad is bonded to a mirror-image bonding pad. Additional substrates are bonded sequentially such that the bonded structure includes an even number of semiconductor substrates of which one half have bonding pads of the primary pattern and are bonded to the side of the first semiconductor substrate, while the other half have bonding pads of the mirror-image pattern and are bonded to the side of the second semiconductor substrate. The mirror-image patterns of the bonding pads enable maximal cancellation of wafer bow to enable stacking of multiple semiconductor substrates by limiting the total wafer bow of the bonded structure.

A multiple-layer 3DI stack is formed based on a bow balanced bonding approach. In this integration sequence, two groups of substrates are employed. Substrates of a first group have front side bonding pads arranged in a primary image, while substrates of a second group have front side bonding pads arranged in a mirror image of the primary image. Substrates are vertically stacked employing the following rules: (a) Odd numbered substrates are selected from the first group and even numbered substrates are selected from the second group; (b) The front side of the first substrate is bonded to the front side of the second substrate; (c) Thin an (i−1)-th substrate after bonding an i-th substrate; (d) The front side of an (i+1) substrate is bonded to the back side of the (i−1)-th substrate after thinning of the (i−1)-th substrate; (e) The steps of (c) and (d) are repeated for each i greater than 2. As a result, the multiple layer stacked 3DI wafer is bow balanced and the maximum number of substrates that can be bonded is increased through the bow balancing.

According to an aspect of the present invention, a method of forming a semiconductor structure is provided, which includes bonding a first substrate having first front side bonding pads on a front surface thereof with a second substrate having second front side bonding pads on a front surface thereof, wherein the first front side bonding pads are arranged in a primary pattern, and the second front side bonding pads are arranged in a mirror image pattern that is a pattern of a mirror image of the primary pattern; and for every integer i greater than 2 and up to an integer N that is at least equal to 4, forming (i−2)-th back side bonding pads on a back surface of the (i−2)-th substrate and bonding an i-th substrate having i-th front side bonding pads on a top surface thereof with the (i−2)-th substrate, wherein the i-th front side bonding pads are bonded to the (i−2)-th back side bonding pads, the i-th back side bonding pads are arranged in the mirror image pattern if i is an odd number and in the primary pattern if i is an even number, and the i-th front side bonding pads are arranged in the primary pattern if i is an odd number and in the mirror image pattern if i is an even number.

According to another aspect of the present invention, a bonded assembly of a plurality of substrates is provided, which includes: a first substrate bonded to a second substrate, wherein the first substrate has first front side bonding pads located on a front surface thereof and the second substrate has second front side bonding pads located on a front surface thereof, wherein the first front side bonding pads are arranged in a primary pattern, the second front side bonding pads are arranged in a mirror image pattern that is a pattern of a mirror image of the primary pattern, and the first front side bonding pads are bonded to the second front side bonding pads; and an i-th semiconductor substrate for every integer i greater than 2 and up to an integer N that is at least equal to 4, wherein (i−2)-th substrate includes (i−2)-th back side bonding pads located on a back surface thereof, the i-th substrate includes i-th front side bonding pads located on a top surface thereof and bonded with the (i−2)-th substrate, wherein the i-th front side bonding pads are bonded to the (i−2)-th back side bonding pads, wherein the i-th back side bonding pads are arranged in the mirror image pattern if i is an odd number and in the primary pattern if i is an even number, and the i-th front side bonding pads are arranged in the primary pattern if i is an odd number and in the mirror image pattern if i is an even number.

DETAILED DESCRIPTION

Figure 1A:
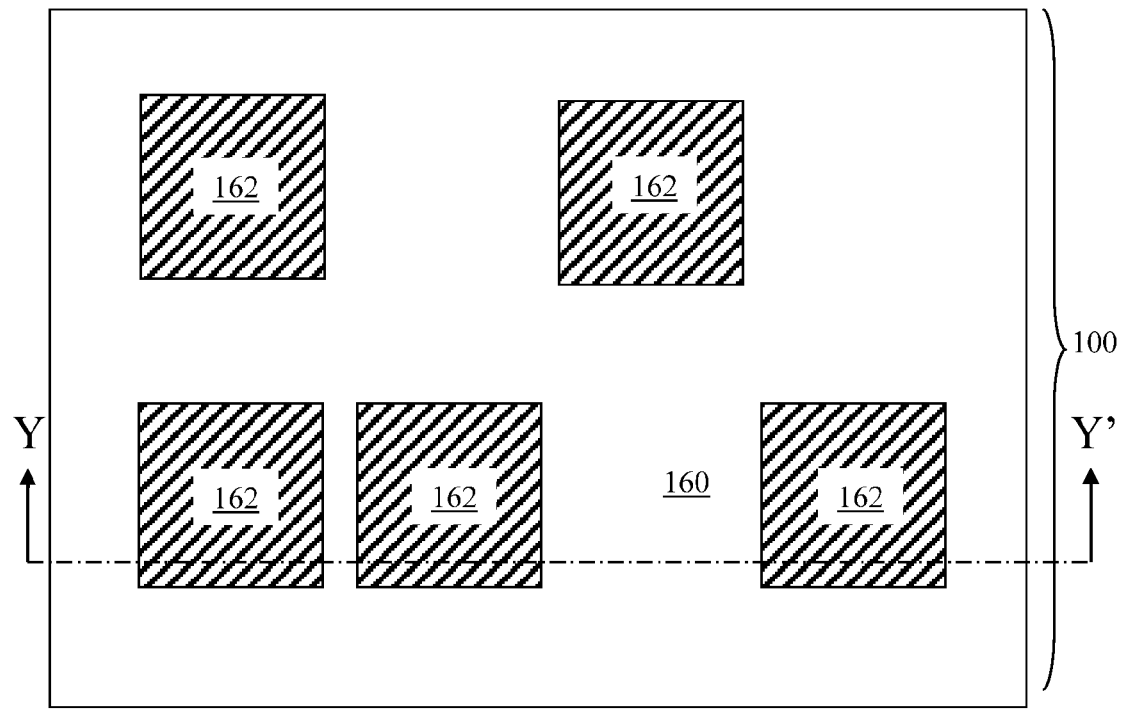
FIG. 1A is a top-down view of a top surface of a first substrate having first front side bonding pads arranged in a first exemplary primary pattern.

As stated above, the present invention relates to methods of stacking semiconductor substrates while maximally compensating for bowing of the semiconductor substrates and a bonded assembly of a plurality of substrates thereby formed, which are now described in detail with accompanying figures. Throughout the drawings, the same reference numerals or letters are used to designate like or equivalent elements. The drawings are not necessarily drawn to scale.

As used herein, a "semiconductor chip" is a structure including at least one of an integrated circuit, a passive component such as a capacitor, a resistor, an inductor, or a diode, or a micro-mechanical-electrical structure (MEMS), or a combination thereof that may be formed on a substrate including a semiconductor material.

As used herein, a "semiconductor substrate" refers to any substrate including a semiconductor material that is suitable for formation of semiconductor devices known in the art. A semiconductor substrate can be a semiconductor wafer having a diameter and including one or more semiconductor chips, or can be a single diced semiconductor chip.

As used herein, an element is "electrically connected" to another element if there exists an electrically conductive path between said element and said other element.

As used herein, an element is "electrically insulated" from another element if there is no electrically conductive path between said element and said other element.

Figure 1B:
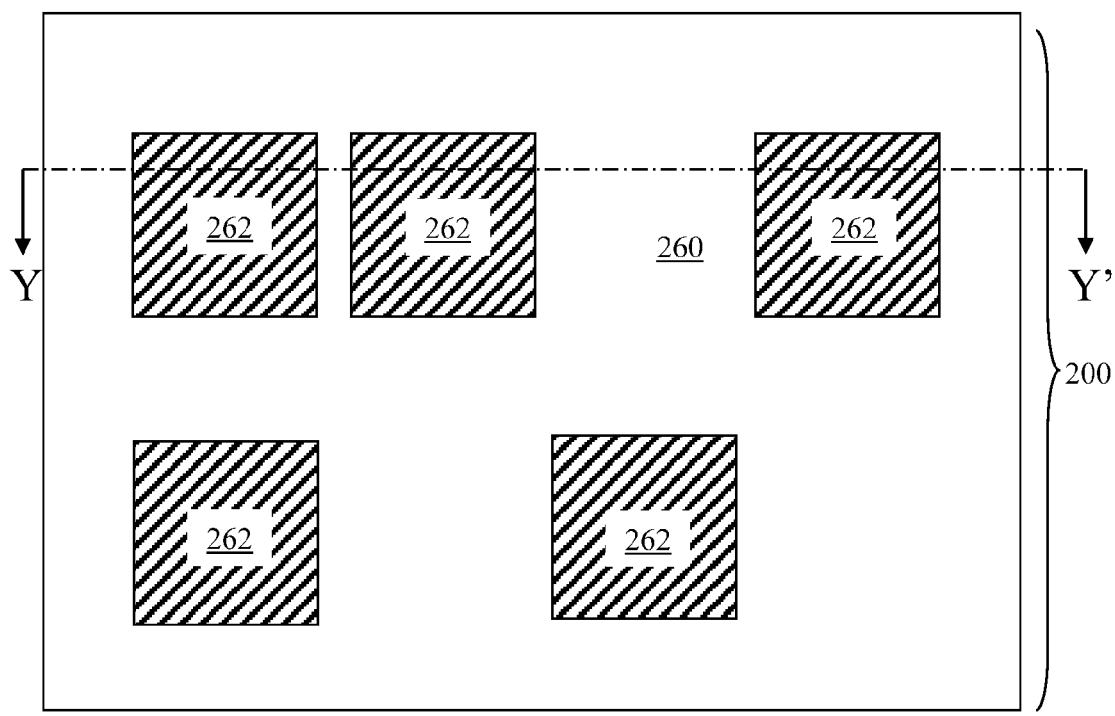
FIG. 1B is a top-down view of a top surface of a second substrate having second front side bonding pads arranged in a first exemplary mirror image pattern.

Referring to FIGS. 1A and 1B, exemplary top-down views of a first substrate 100 and a second substrate 200 according to an embodiment of the present invention are shown. Each of the first substrate 100 and the second substrate 200 can be an individual semiconductor chip or a semiconductor wafer including a plurality of semiconductor chips. While the present invention is described employing the first substrate 100 and the second substrate 200, each representing a single semiconductor chip, the present invention can be practiced employing semiconductor wafer having a diameter from 100 mm to 300 mm and including multiple semiconductor chips provided that each semiconductor wafer includes a pattern of bonding pads that satisfy the symmetry requirement described below.

Specifically, FIG. 1A is a top-down view of a top surface of a first substrate 100 having first front side bonding pads 162 arranged in a first exemplary primary pattern. The first front side bonding pads 162 are composed of a metallic material such as copper, and are embedded in a first front side dielectric layer 160 that is composed of a dielectric material such as silicon oxide, silicon nitride, or silicon oxynitride. FIG. 1B is a top-down view of a top surface of a second substrate 200 having second front side bonding pads 262 arranged in a first exemplary mirror image pattern. The second front side bonding pads 262 are composed of a metallic material such as copper, and are embedded in a second front side dielectric layer 260 that is composed of a dielectric material such as silicon oxide, silicon nitride, or silicon oxynitride.

The first exemplary mirror image pattern is the mirror image pattern of the first exemplary primary pattern. Thus, the first exemplary primary pattern on the topmost surface of the first substrate 100 is congruent with the first exemplary mirror image pattern on the topmost surface of the second substrate 200 if the second substrate 200 is flipped upside down and the exposed surfaces of the second front side bonding pads 262 and the second front side dielectric layer 260 are brought into physical contact with the exposed surfaces of the first front side bonding pads 162 and the first front side dielectric layer 160.

Figure 2A:
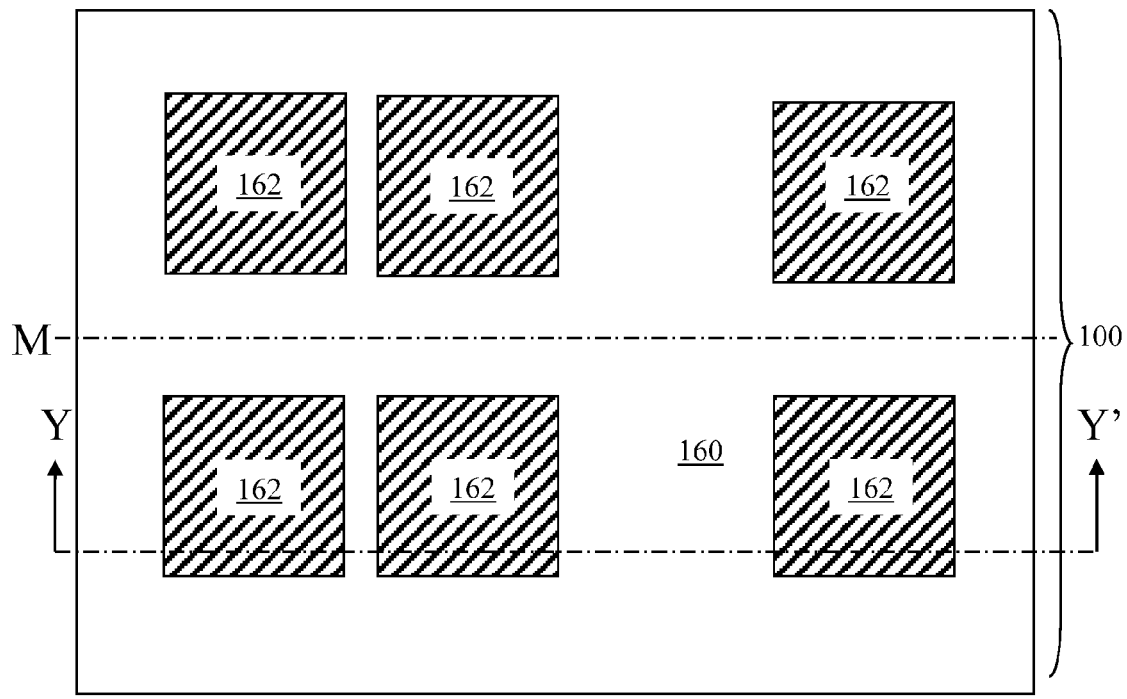
FIG. 2A is a top-down view of a top surface of a first substrate having first front side bonding pads arranged in a second exemplary primary pattern.
Figure 2B:
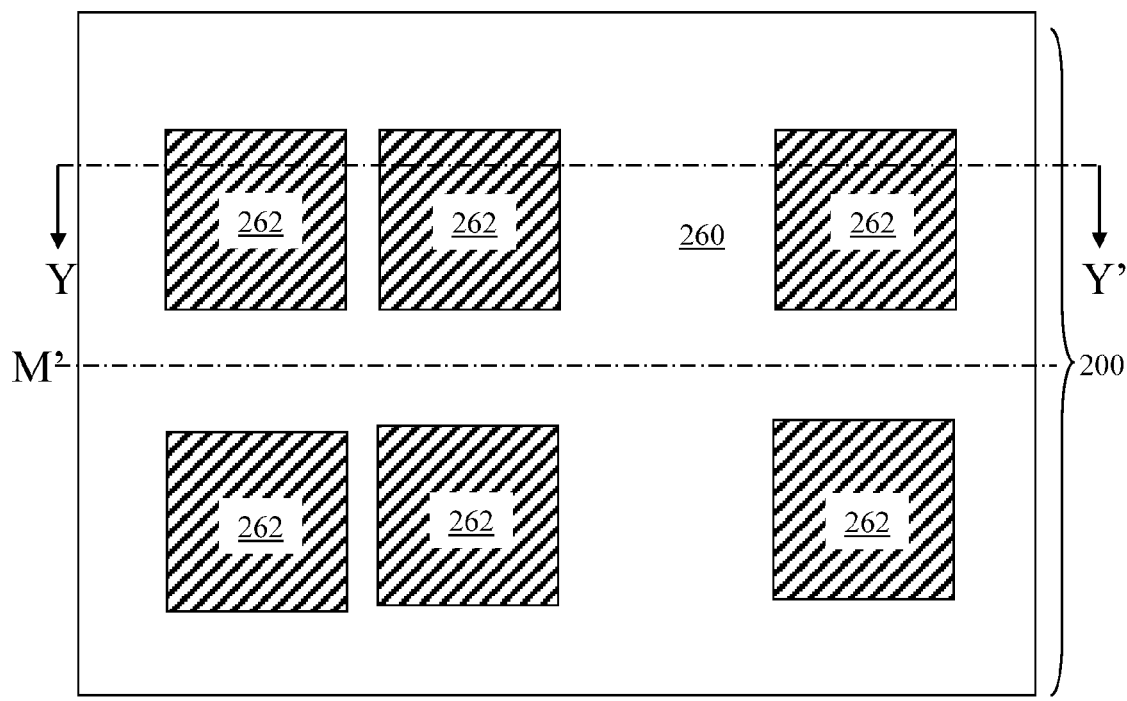
FIG. 2B is a top-down view of a top surface of a second substrate having second front side bonding pads arranged in a second exemplary mirror image pattern, which is identical with the second exemplary primary pattern.

Referring to FIGS. 2A and 2B, exemplary top-down views of a first substrate 100 and a second substrate 200 according to another embodiment of the present invention are shown. FIG. 2A is a top-down view of a top surface of a first substrate 100 having first front side bonding pads 162 arranged in a second exemplary primary pattern. The first front side bonding pads 162 are composed of a metallic material such as copper, and are embedded in a first front side dielectric layer 160 that is composed of a dielectric material such as silicon oxide, silicon nitride, or silicon oxynitride. FIG. 2B is a top-down view of a top surface of a second substrate 200 having second front side bonding pads 262 arranged in a second exemplary mirror image pattern. The second front side bonding pads 262 are composed of a metallic material such as copper, and are embedded in a second front side dielectric layer 260 that is composed of a dielectric material such as silicon oxide, silicon nitride, or silicon oxynitride.

The second exemplary mirror image pattern is the mirror image pattern of the second exemplary primary pattern. The second exemplary primary pattern has a mirror symmetry about an axis M. Likewise, the second exemplary mirror image pattern has a mirror symmetry about an axis M'. Thus, the second exemplary mirror image pattern is identical with the second exemplary primary pattern. The second exemplary primary pattern on the topmost surface of the first substrate 100 is congruent with the second exemplary mirror image pattern on the topmost surface of the second substrate 200 if the second substrate 200 is flipped upside down and the exposed surfaces of the second front side bonding pads 262 and the second front side dielectric layer 260 are brought into physical contact with the exposed surfaces of the first front side bonding pads 162 and the first front side dielectric layer 160.

Figure 3:
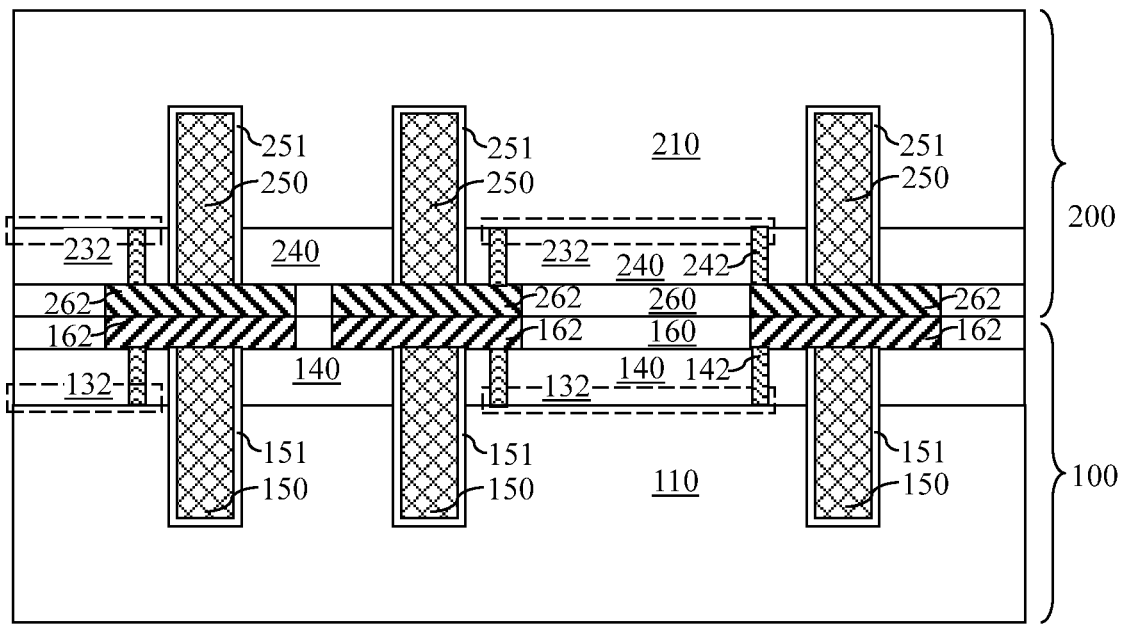
FIGS. 3-12 are sequential vertical cross-sectional views of a first exemplary structure along a vertical plane corresponding to the Y-Y' plane in FIGS. 1A and 1B or the Y-Y' plane in FIGS. 2A and 2B according to a first embodiment of the present invention.

Referring to FIG. 3, a first exemplary structure including a first substrate 100 and a second substrate 200 is shown after bonding. Prior to bonding, the first substrate 100 and the second substrate 200 are provided as two discrete substrates. The first substrate 100 includes a first semiconductor substrate 110, which can be a semiconductor-on-insulator (SOI) substrate, a bulk semiconductor substrate, or a hybrid substrate including at least one SOI portion and at least one bulk portion. The first semiconductor substrate 110 includes a first semiconductor material layer that is located at least on the top surface of the first semiconductor substrate 110. The first semiconductor material layer can be, for example, a top semiconductor layer of an SOT substrate or a bulk semiconductor layer of a bulk semiconductor substrate. The semiconductor material of the first semiconductor material layer may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. The semiconductor material can be polycrystalline or single crystalline, and is preferably single crystalline. For example, the first semiconductor material layer may be composed of single crystalline silicon. The thickness of the first substrate 100 can be from 500 microns to 1,000 microns, although lesser and greater thicknesses can also be employed.

At least one first semiconductor device 132 is formed on the top surface of the first semiconductor substrate 110. The at least one first semiconductor device 132 can be, for example, a field effect transistor, a bipolar transistor, a thyristor, a varactor, a diode, an electrical fuse, or any other type of semiconductor device known in the art. The side of the first semiconductor substrate 110 including the at least one first semiconductor device 132 is herein referred to as a front side, and the opposite side of the first semiconductor substrate 110 is herein referred to as a back side of the first semiconductor substrate 110.

A first interconnect dielectric layer 140 can be formed over the at least one first semiconductor device 132 on the front side of the first semiconductor substrate 110. The first interconnect dielectric layer 140 can be composed of a dielectric material such as silicon oxide, silicon nitride, organosilicate glass (OSG), or any other dielectric material employed for constructing a metal interconnect layer in the art. The first interconnect dielectric layer 140 can be a single layer of homogeneous dielectric materials, or can be a plurality of layers having different compositions. At least one first metal interconnect structure 142 can be formed in the first interconnect dielectric layer 140. Each of the at least one first metal interconnect structure 142 can be a conductive via structure, a conductive line structure, or a combination of at least one conductive via structure and at least one conductive line structure that are electrically connected among one another and electrically connected to one of the at least one first semiconductor device 132. The at least one first metal interconnect structure 142 is embedded in the first interconnect dielectric layer 140. The thickness of the first interconnect dielectric layer 140 can be from 100 nm to 20 microns, although lesser and greater thicknesses can also be employed.

First dielectric through-substrate via (TSV) liners 151 and first conductive though-substrate via (TSV) structures 150 are formed in the first substrate 100 employing methods known in the art. As provided, the first dielectric TSV liners 151 and the conductive first TSV structures 150 are embedded in the first substrate 100, and are not exposed at the back side surface of the first substrate 100, i.e., at the back side surface of the first semiconductor substrate 110.

A first front side dielectric layer 160 is subsequently formed on the first interconnect dielectric layer 140. The first front side dielectric layer 160 is composed of a dielectric material such as silicon oxide, silicon nitride, silicon oxynitride, or a combination thereof. The first front side bonding pads 162 are formed in the first front side dielectric layer 160 such that each of the first front side bonding pads 162 is electrically connected to a first conductive TSV structure 150. The first front side bonding pads 162 are composed of a conductive material such as an elemental metal, an intermetallic alloy, a conductive metallic nitride or carbide, or a combination thereof. Further, the first front side bonding pads 162 can be electrically connected to at least one first metal interconnect structure 142. The first front side bonding pads 162 are embedded in the first front side dielectric layer 160. The thickness of the first front side dielectric layer 160 can be from 0.2 micron to 10 microns, although lesser and greater thicknesses can also be employed.

The second substrate 200 includes a second semiconductor substrate 210, which can be a semiconductor-on-insulator (SOI) substrate, a bulk semiconductor substrate, or a hybrid substrate including at least one SOI portion and at least one bulk portion. The second semiconductor substrate 210 includes a second semiconductor material layer that is located at least on the top surface of the second semiconductor substrate 210. The second semiconductor material layer can be, for example, a top semiconductor layer of an SOI substrate or a bulk semiconductor layer of a bulk semiconductor substrate. The semiconductor material of the second semiconductor material layer may be selected from any material that can be employed for the first semiconductor material layer in the first substrate 100. The thickness of the second substrate 200 can be from 500 microns to 1,000 microns, although lesser and greater thicknesses can also be employed.

At least one second semiconductor device 232 is formed on the top surface of the second semiconductor substrate 210. The at least one second semiconductor device 232 can be any of the devices that can be employed for the at least one first semiconductor device 132. The side of the second semiconductor substrate 210 including the at least one second semiconductor device 232 is herein referred to as a front side, and the opposite side of the second semiconductor substrate 210 is herein referred to as a back side of the second semiconductor substrate 210.

A second interconnect dielectric layer 240 can be formed over the at least one second semiconductor device 232 on the front side of the second semiconductor substrate 210. The second interconnect dielectric layer 240 can be composed of a dielectric material such as silicon oxide, silicon nitride, organosilicate glass (OSG), or any other dielectric material employed for constructing a metal interconnect layer in the art. The second interconnect dielectric layer 240 can be a single layer of homogeneous dielectric materials, or can be a plurality of layers having different compositions. At least one second metal interconnect structure 242 can be formed in the second interconnect dielectric layer 240. Each of the at least one second metal interconnect structure 242 can be a conductive via structure, a conductive line structure, or a combination of at least one conductive via structure and at least one conductive line structure that are electrically connected among one another and electrically connected to one of the at least one second semiconductor device 232. The at least one second metal interconnect structure 242 is embedded in the second interconnect dielectric layer 240. The thickness of the second interconnect dielectric layer 240 can be from 100 nm to 20 microns, although lesser and greater thicknesses can also be employed.

Second dielectric through-substrate via (TSV) liners 251 and second conductive though-substrate via (TSV) structures 250 are formed in the second substrate 200 employing methods known in the art. As provided, the second dielectric TSV liners 251 and the conductive second TSV structures 250 are embedded in the second substrate 200, and are not exposed at the back side surface of the second substrate 200, i.e., at the back side surface of the second semiconductor substrate 210.

A second front side dielectric layer 260 is subsequently formed on the second interconnect dielectric layer 240. The second front side dielectric layer 260 is composed of a dielectric material such as silicon oxide, silicon nitride, silicon oxynitride, or a combination thereof. The second front side bonding pads 262 are formed in the second front side dielectric layer 260 such that each of the second front side bonding pads 262 is electrically connected to second conductive TSV structure 250. The second front side bonding pads 262 are composed of a conductive material such as an elemental metal, an intermetallic alloy, a conductive metallic nitride or carbide, or a combination thereof. Further, the second front side bonding pads 262 can be electrically connected to at least one second metal interconnect structure 242. The second front side bonding pads 262 are embedded in the second front side dielectric layer 260. The thickness of the second front side dielectric layer 260 can be from 0.2 micron to 10 microns, although lesser and greater thicknesses can also be employed.

The first front side bonding pads 162 are arranged in a primary pattern, and the second front side bonding pads 262 are arranged in a mirror-image pattern, which is the pattern of the mirror image of the primary pattern. The pair of the primary pattern and the mirror image pattern may not be identical with each other as in the case of the first exemplary primary pattern and the first exemplary mirror image pattern in FIGS. 1A and 1B, or may be identical with each other as in the case of the second exemplary primary pattern and the second exemplary mirror image pattern in FIGS. 2A and 2B. Each first front side bonding pad 162 is bonded to the corresponding second front side bonding pad 262, which is located at the mirror image position on the second substrate 200. Each boundary of a first front side bonding pad 162 coincides with the boundary of the corresponding second front side bonding pad 262 upon bonding, and vice versa. The bonding can be effected by metal-to-metal bonding between the first front side bonding pads 162 and the second front side bonding pads 262, dielectric-to-dielectric bonding between the dielectric materials of the first front side dielectric layer 160 and the second front side dielectric layer 260, or a combination thereof. Because of the presence of mirror image matching between the first front side bonding pads 162 and the second front side bonding pads 262, the substrate bow due to bonding of the first substrate 100 and the second substrate 200 is minimized.

The first substrate 100 includes first semiconductor chips, and the second substrate 200 includes second semiconductor chips. Typically, the first semiconductor chips in the first substrate 100 are arranged in an array, e.g., a rectangular array, and the second semiconductor chips in the second substrate 200 are arranged in another array. In one embodiment, the second semiconductor chips are mirror image chips of the first semiconductor chips, and the arrays in the first and second substrates (100, 200) are identical. In another embodiment, the first semiconductor chips and the second semiconductor chips are identical among one another and have built-in mirror symmetry, and the arrays in the first and second substrates (100, 200) are identical. In these embodiments, the structure of the second substrate 200 as a whole can be a mirror image structure of the first substrate 100. Consequently, the intrinsic substrate bow in the second substrate 200 has a mirror image pattern of the intrinsic substrate bow in the first substrate 100. Upon bonding of the second substrate 200 with the first substrate, the two intrinsic substrate bows cancel each other so that the net substrate bow of the bonded structure in FIG. 3 is zero.

Figure 4:
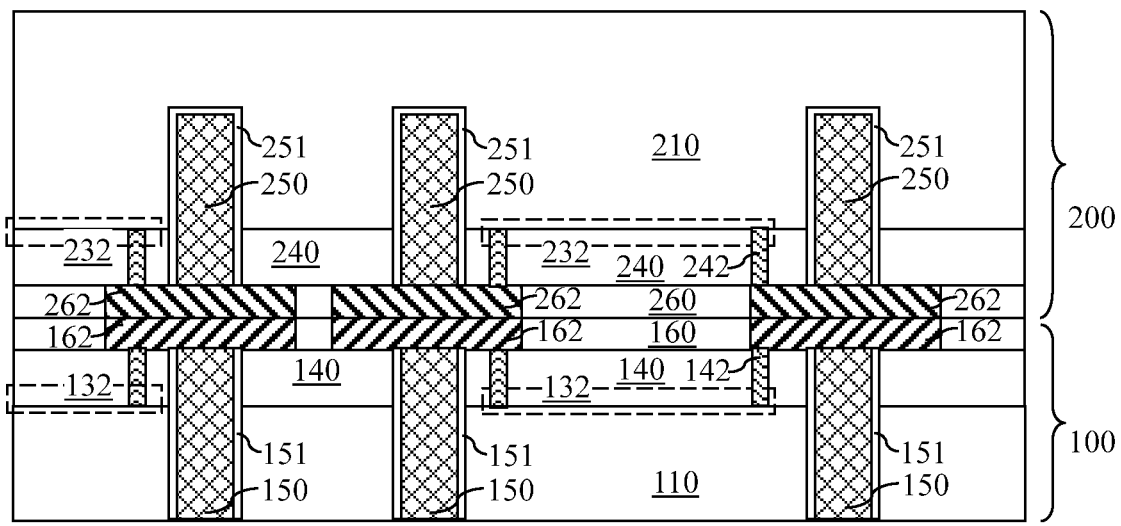

Referring to FIG. 4, the first substrate 100 is thinned employing the second substrate 200 as a handle substrate for providing mechanical support. For example, the back side of the first substrate 100 is removed by grinding, chemical mechanical planarization (CMP), a recess etch, or a combination thereof. The bottom surfaces of the first conductive TSV structures 150 are exposed. The remaining portions of the first dielectric TSV liner 151 become dielectric cylindrical structures that are topologically homeomorphic to a torus.

It is understood that any thinned semiconductor substrate, such as the first semiconductor substrate 110 after thinning, can be a bulk substrate if the initial substrate is a bulk substrate or can include a buried insulator layer and/or a remaining portion of a handle substrate if the initial substrate is an SOI substrate. Typical materials employed for the handle substrate include a semiconductor material and/or silicate glass.

Figure 5:
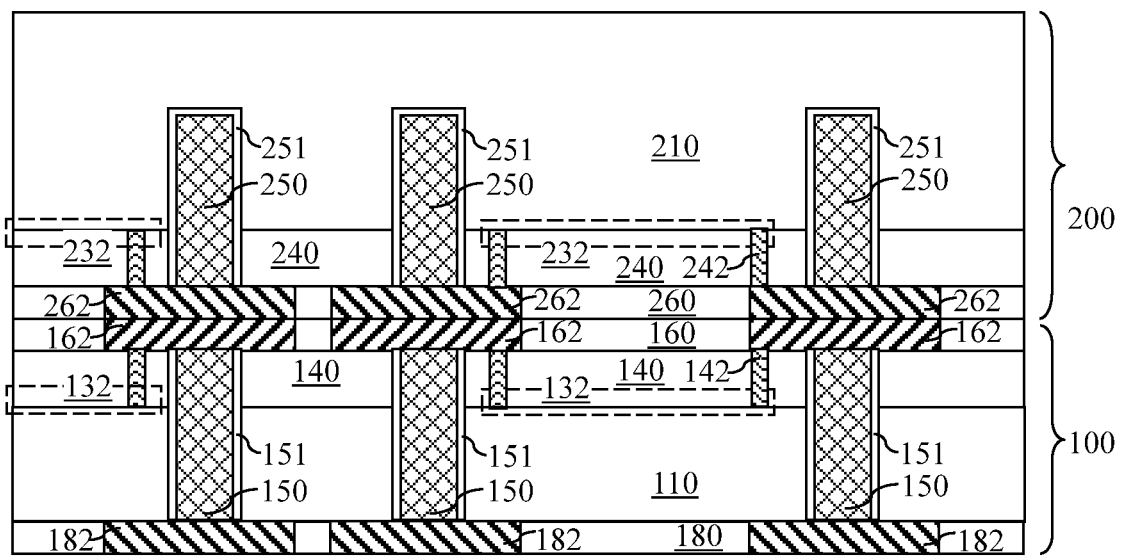

Referring to FIG. 5, a first back side dielectric layer 180 is formed on the back side of the first substrate 100. The first back side dielectric layer 180 can be formed directly on the end surfaces of the first conductive TSV structures 150. The first back side dielectric layer 180 is composed of a dielectric material such as silicon oxide, silicon nitride, silicon oxynitride, or a combination thereof. The first back side bonding pads 182 are formed in the first back side dielectric layer 180 such that each of the first back side bonding pads 182 is electrically connected to one of the first conductive TSV structures 150. The first back side bonding pads 182 are embedded in the first back side dielectric layer 180. The thickness of the first back side dielectric layer 180 can be from 0.2 micron to 10 microns, although lesser and greater thicknesses can also be employed. The thickness of the first substrate 100 after formation of the first back side dielectric layer 180 and the first back side bonding pads 182 can be from 20 microns to 200 microns, although lesser and greater thicknesses can also be employed. The first back side bonding pads 182 are arranged in the mirror-image pattern (as observed from below toward the exposed surfaces of the first back side bonding pads 182), which is the pattern of the second front side bonding pads 262 embedded in the second front side dielectric layer 260.

Figure 6:
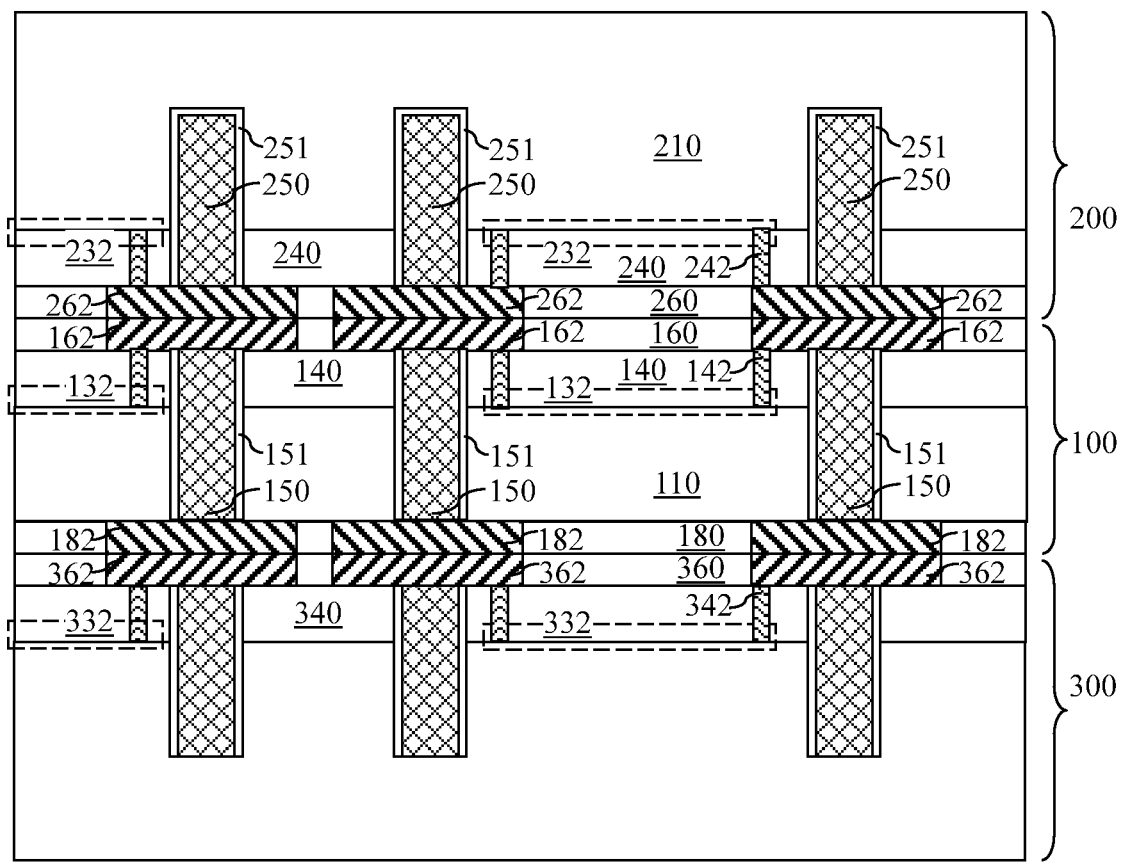

Referring to FIG. 6, the assembly of the first substrate 100 and the second substrate 200 is bonded to a third substrate 300. The third substrate 300 includes a third semiconductor substrate 310, which can be a semiconductor-on-insulator (SOI) substrate, a bulk semiconductor substrate, or a hybrid substrate including at least one SOT portion and at least one bulk portion. The third semiconductor substrate 310 includes a third semiconductor material layer that is located at least on the top surface of the third semiconductor substrate 310. The third semiconductor material layer can be, for example, a top semiconductor layer of an SOI substrate or a bulk semiconductor layer of a bulk semiconductor substrate. The semiconductor material of the third semiconductor material layer may be selected from any material that can be employed for the first semiconductor material layer in the first substrate 100. The thickness of the third substrate 300 can be from 500 microns to 1,000 microns, although lesser and greater thicknesses can also be employed.

At least one third semiconductor device 332 is formed on the top surface of the third semiconductor substrate 310. The at least one third semiconductor device 332 can be any of the devices that can be employed for the at least one first semiconductor device 132. The side of the third semiconductor substrate 310 including the at least one third semiconductor device 332 is herein referred to as a front side, and the opposite side of the third semiconductor substrate 310 is herein referred to as a back side of the third semiconductor substrate 310.

A third interconnect dielectric layer 340 can be formed over the at least one third semiconductor device 332 on the front side of the third semiconductor substrate 310. The third interconnect dielectric layer 340 can be composed of a dielectric material such as silicon oxide, silicon nitride, organosilicate glass (OSG), or any other dielectric material that can be employed for the first and second interconnect dielectric layers (140, 240). The third interconnect dielectric layer 340 can be a single layer of homogeneous dielectric materials, or can be a plurality of layers having different compositions. At least one third metal interconnect structure 342 can be formed in the third interconnect dielectric layer 340. Each of the at least one third metal interconnect structure 342 can be a conductive via structure, a conductive line structure, or a combination of at least one conductive via structure and at least one conductive line structure that are electrically connected among one another and electrically connected to one of the at least one third semiconductor device 332. The at least one third metal interconnect structure 342 is embedded in the third interconnect dielectric layer 340. The thickness of the third interconnect dielectric layer 340 can be from 100 nm to 30 microns, although lesser and greater thicknesses can also be employed.

Third dielectric through-substrate via (TSV) liners 351 and third conductive though-substrate via (TSV) structures 350 are formed in the third substrate 300 employing methods known in the art. As provided, the third dielectric TSV liners 351 and the conductive third TSV structures 350 are embedded in the third substrate 300, and are not exposed at the back side surface of the third substrate 300, i.e., at the back side surface of the third semiconductor substrate 310.

A third front side dielectric layer 360 is located on the third interconnect dielectric layer 340. The third front side dielectric layer 360 is composed of a dielectric material such as silicon oxide, silicon nitride, silicon oxynitride, or a combination thereof. Third front side bonding pads 362 are formed in the third front side dielectric layer 360 such that each of the third front side bonding pads 362 is electrically connected to third conductive TSV structure 350. The third front side bonding pads 362 are composed of a conductive material such as an elemental metal, an intermetallic alloy, a conductive metallic nitride or carbide, or a combination thereof. Further, the third front side bonding pads 362 can be electrically connected to at least one third metal interconnect structure 342. The third front side bonding pads 362 are embedded in the third front side dielectric layer 360. The thickness of the third front side dielectric layer 360 can be from 0.2 micron to 10 microns, although lesser and greater thicknesses can also be employed.

The third front side bonding pads 362 are arranged in the primary pattern (as observed from above toward the exposed surfaces of the third front side bonding pads 362), which is the pattern of the first front side bonding pads 162 embedded in the first front side dielectric layer 160. As discussed above, the first back side bonding pads 182 are arranged in the mirror image pattern as observed from below. Each third front side bonding pad 362 can be bonded to the corresponding first back side bonding pad 182, which is located at the mirror image position on the first substrate 200. Each boundary of a third front side bonding pad 362 coincides with the boundary of the corresponding first back side bonding pad 182 upon bonding, and vice versa. The bonding can be effected by metal-to-metal bonding between the third front side bonding pads 362 and the first back side bonding pads 182, dielectric-to-dielectric bonding between the dielectric materials of the third front side dielectric layer 360 and the first back side dielectric layer 180, or a combination thereof.

The third substrate 300 includes third semiconductor chips. Typically, the third semiconductor chips in the third substrate 300 are arranged in an array. In one embodiment, the third semiconductor chips are identical chips as the first semiconductor chips, and the arrays in the first and third substrates (100, 300) are identical. In another embodiment, the first semiconductor chips, the second semiconductor chips, and the third semiconductor chips are identical among one another and have built-in mirror symmetry, and the arrays in the first, second, and third substrates (100, 200, 300) are identical. In these embodiments, the structure of an upper portion of the third substrate 300 as a whole can have the same structure as the first substrate 100 as thinned.

Figure 7:
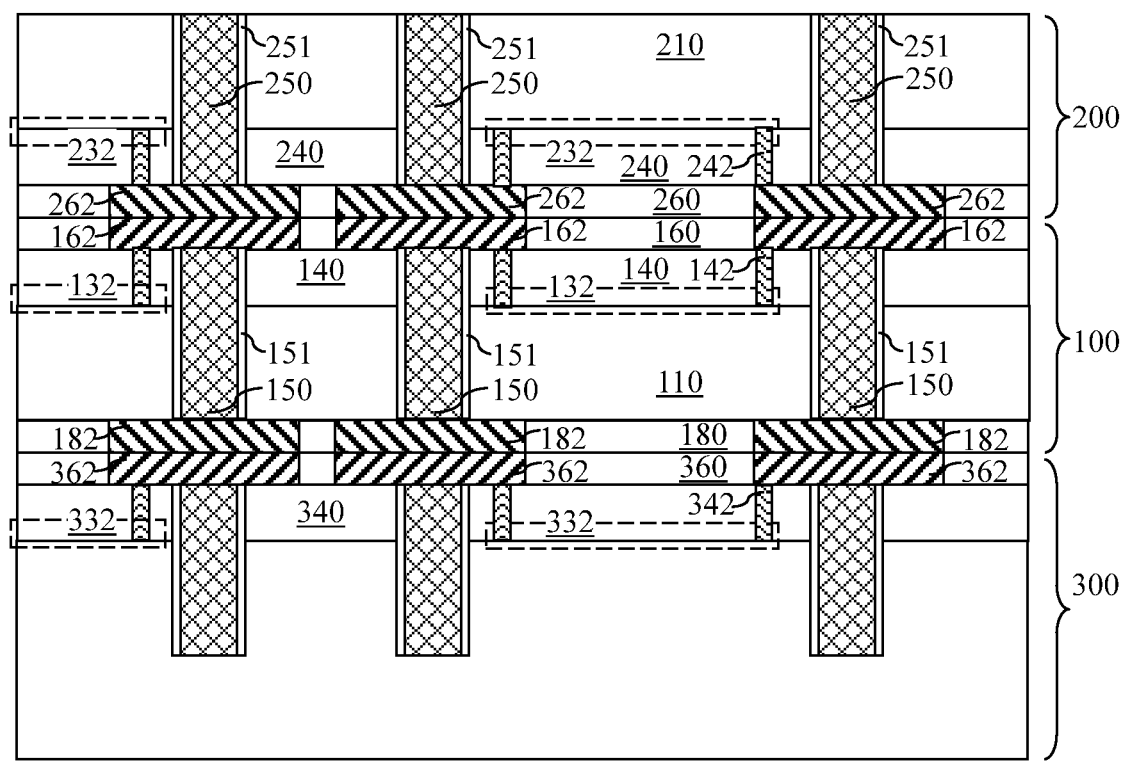

Referring to FIG. 7, the second substrate 200 is thinned employing the third substrate 300 as a handle substrate for providing mechanical support. For example, the back side of the second substrate 200, which is the upper side of the assembly of substrates (100, 200, 300) because the second substrate 200 is positioned upside down in the assembly, is removed by grinding, chemical mechanical planarization (CMP), a recess etch, or a combination thereof. The bottom surfaces, which are the uppermost surfaces as positioned upside down, of the second conductive TSV structures 250 are exposed. The remaining portions of the second dielectric TSV liner 251 become dielectric cylindrical structures that are topologically homeomorphic to a torus.

Figure 8:
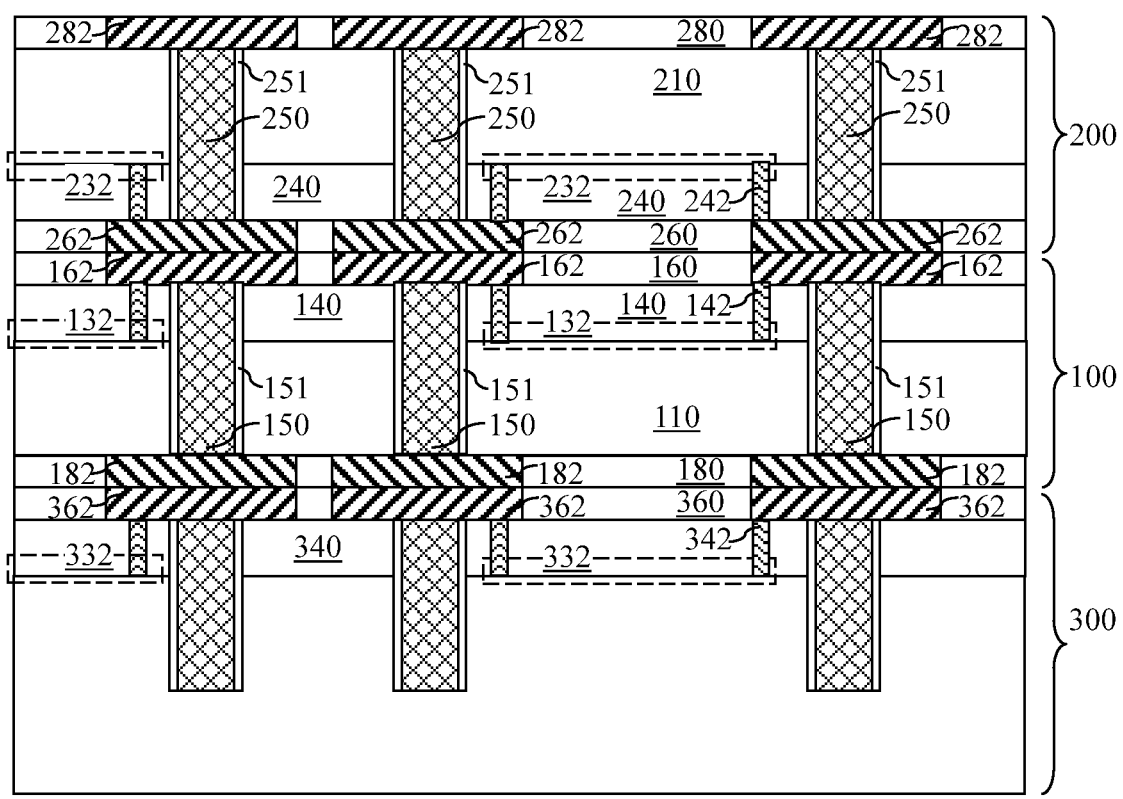

Referring to FIG. 8, a second back side dielectric layer 280 is formed on the back side of the second substrate 200, which is the uppermost surface of the assembly of substrates (100, 200, 300). The second back side dielectric layer 280 can be formed directly on the end surfaces of the second conductive TSV structures 250. The second back side dielectric layer 280 is composed of a dielectric material such as silicon oxide, silicon nitride, silicon oxynitride, or a combination thereof. The second back side bonding pads 282 are formed in the second back side dielectric layer 280 such that each of the second back side bonding pads 282 is electrically connected to one of the second conductive TSV structures 250. The second back side bonding pads 282 are embedded in the second back side dielectric layer 280. The thickness of the second back side dielectric layer 280 can be from 0.2 micron to 10 microns, although lesser and greater thicknesses can also be employed. The thickness of the second substrate 200 after formation of the second back side dielectric layer 280 and the second back side bonding pads 282 can be from 20 microns to 200 microns, although lesser and greater thicknesses can also be employed. The second back side bonding pads 282 are arranged in the primary pattern (as observed from above toward the exposed surfaces of the second back side bonding pads 282), which is the pattern of the first front side bonding pads 162 embedded in the first front side dielectric layer 160.

In the embodiment in which the second semiconductor chips are mirror image chips of the first semiconductor chips and the arrays in the first and second substrates (100, 200) are identical, the thickness of the second substrate 200 can be identical with the thickness of the first substrate 100 after formation of the second back side dielectric layer 280 and the second back side bonding pads 282 in order to maximize the cancellation of intrinsic substrate bows between the first substrate 100 and the second substrate 200. In the embodiment in which the first semiconductor chips and the second semiconductor chips are identical among one another and have built-in mirror symmetry and the arrays in the first and second substrates (100, 200) are identical, the thickness of the second substrate 200 can be identical with the thickness of the first substrate 100 after formation of the second back side dielectric layer 280 and the second back side bonding pads 282 in order to maximize the cancellation of intrinsic substrate bows between the first substrate 100 and the second substrate 200. In these embodiments, the structure of the second substrate 200 at this stage can be a mirror image structure of the first substrate 100 at this stage. Consequently, the intrinsic substrate bow in the second substrate 200 has a mirror image pattern of the intrinsic substrate bow in the first substrate 100, and the two intrinsic substrate bows cancel each other so that the net substrate bow of the first and second substrates (100, 200) is zero, and the only non-zero contribution to total substrate bow is due to the third substrate 300 at this step.

Figure 9:
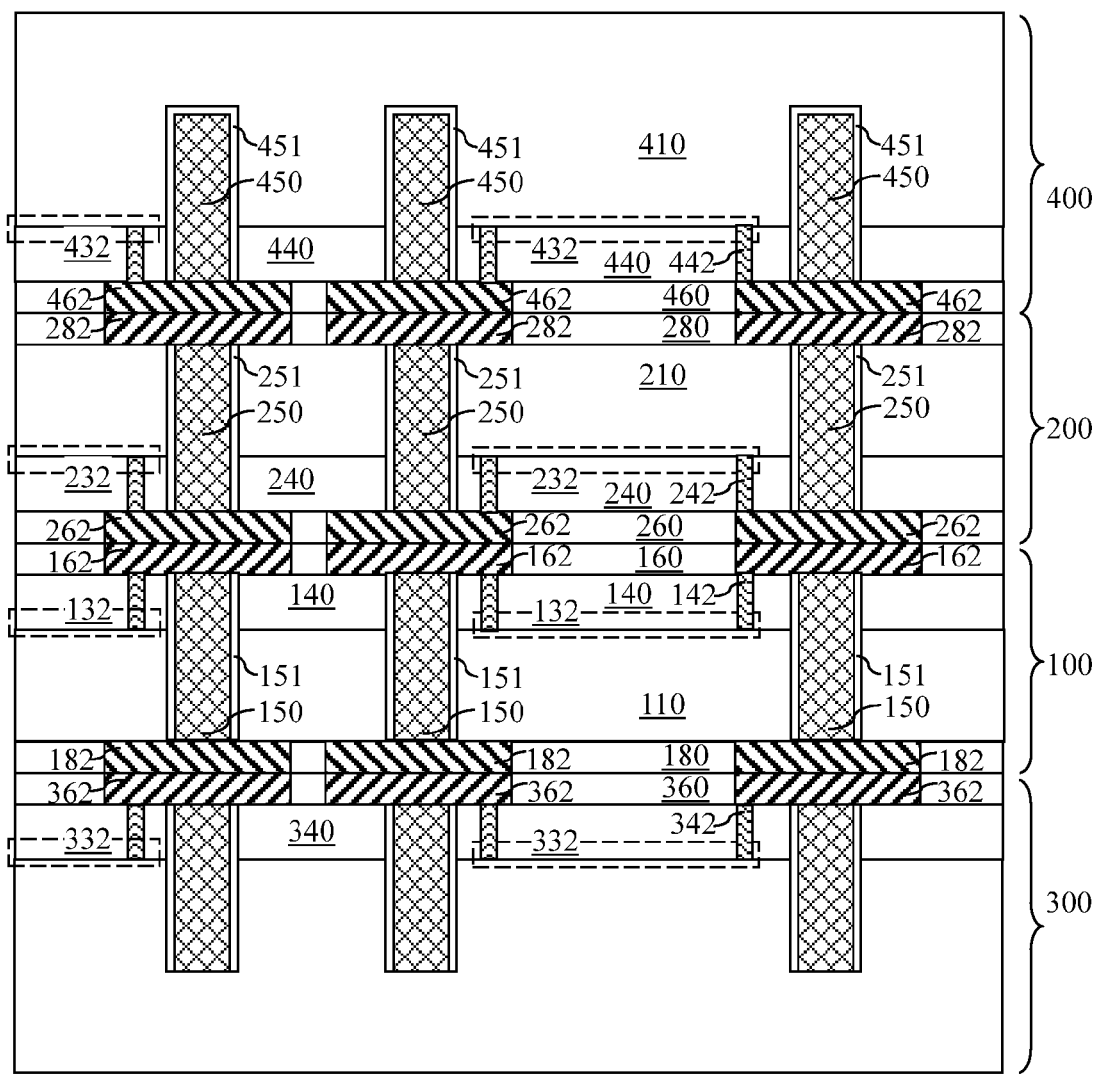

Referring to FIG. 9, the assembly of the first, second, and third substrates (100, 200, 300) is bonded to a fourth substrate 400. The fourth substrate 400 includes a fourth semiconductor substrate 410, which can be a semiconductor-on-insulator (SOI) substrate, a bulk semiconductor substrate, or a hybrid substrate including at least one SOI portion and at least one bulk portion. The fourth semiconductor substrate 410 includes a fourth semiconductor material layer that is located at least on the top surface of the fourth semiconductor substrate 410. The fourth semiconductor material layer can be, for example, a top semiconductor layer of an SOT substrate or a bulk semiconductor layer of a bulk semiconductor substrate. The semiconductor material of the fourth semiconductor material layer may be selected from any material that can be employed for the fourth semiconductor material layer in the fourth substrate 400. The thickness of the fourth substrate 400 can be from 500 microns to 1,000 microns, although lesser and greater thicknesses can also be employed.

At least one fourth semiconductor device 432 is located on the top surface of the fourth semiconductor substrate 410. The at least one fourth semiconductor device 432 can be any of the devices that can be employed for the at least one fourth semiconductor device 432. The side of the fourth semiconductor substrate 410 including the at least one fourth semiconductor device 432 is herein referred to as a front side, and the opposite side of the fourth semiconductor substrate 410 is herein referred to as a back side of the fourth semiconductor substrate 410.

A fourth interconnect dielectric layer 440 is located on the at least one fourth semiconductor device 432 on the front side of the fourth semiconductor substrate 410. The fourth interconnect dielectric layer 440 can be composed of a dielectric material such as silicon oxide, silicon nitride, organosilicate glass (OSG), or any other dielectric material that can be employed for the first, second, and third interconnect dielectric layers (140, 240, 340). The fourth interconnect dielectric layer 440 can be a single layer of homogeneous dielectric materials, or can be a plurality of layers having different compositions. At least one fourth metal interconnect structure 442 can be formed in the fourth interconnect dielectric layer 440. Each of the at least one fourth metal interconnect structure 442 can be a conductive via structure, a conductive line structure, or a combination of at least one conductive via structure and at least one conductive line structure that are electrically connected among one another and electrically connected to one of the at least one fourth semiconductor device 432. The at least one fourth metal interconnect structure 442 is embedded in the fourth interconnect dielectric layer 440. The thickness of the fourth interconnect dielectric layer 440 can be from 100 nm to 30 microns, although lesser and greater thicknesses can also be employed.

Fourth dielectric through-substrate via (TSV) liners 451 and fourth conductive though-substrate via (TSV) structures 450 are formed in the fourth substrate 400 employing methods known in the art. As provided, the fourth dielectric TSV liners 451 and the conductive fourth TSV structures 450 are embedded in the fourth substrate 400, and are not exposed at the back side surface of the fourth substrate 400, i.e., at the back side surface of the fourth semiconductor substrate 410.

A fourth front side dielectric layer 460 is located on the fourth interconnect dielectric layer 440. The fourth front side dielectric layer 460 is composed of a dielectric material such as silicon oxide, silicon nitride, silicon oxynitride, or a combination thereof. Fourth front side bonding pads 462 are formed in the fourth front side dielectric layer 460 such that each of the fourth front side bonding pads 462 is electrically connected to fourth conductive TSV structure 450. The fourth front side bonding pads 462 are composed of a conductive material such as an elemental metal, an intermetallic alloy, a conductive metallic nitride or carbide, or a combination thereof. Further, the fourth front side bonding pads 462 can be electrically connected to at least one fourth metal interconnect structure 442. The fourth front side bonding pads 462 are embedded in the fourth front side dielectric layer 460. The thickness of the fourth front side dielectric layer 460 can be from 0.2 micron to 10 microns, although lesser and greater thicknesses can also be employed.

The fourth front side bonding pads 462 are arranged in the mirror image pattern, which is the pattern of the second front side bonding pads 262 embedded in the second front side dielectric layer 260. As discussed above, the second back side bonding pads 282 are arranged in the primary pattern. Each fourth front side bonding pad 462 can be bonded to the corresponding second back side bonding pad 282, which is located at the mirror image position on the second substrate 200. Each boundary of a fourth front side bonding pad 462 coincides with the boundary of the corresponding second back side bonding pad 282 upon bonding, and vice versa. The bonding can be effected by metal-to-metal bonding between the fourth front side bonding pads 462 and the second back side bonding pads 282, dielectric-to-dielectric bonding between the dielectric materials of the fourth front side dielectric layer 460 and the second back side dielectric layer 280, or a combination thereof.

The fourth substrate 400 includes fourth semiconductor chips. Typically, the fourth semiconductor chips in the fourth substrate 400 are arranged in an array. In the embodiment in which the second semiconductor chips are mirror image chips of the first semiconductor chips and the arrays in the first and second substrates (100, 200) are identical, the fourth semiconductor chips can be mirror image chips of the third semiconductor chips and the arrays in the third and fourth substrates (300, 400) are identical. Further, the thickness of the fourth substrate 400 can be substantially the same as the thickness of the third substrate 300 in order to maximize the cancellation of intrinsic substrate bows between the third substrate 300 and the fourth substrate 400. In addition, in the embodiment in which the first semiconductor chips and the second semiconductor chips are identical among one another and have built-in mirror symmetry and the arrays in the first and second substrates (100, 200) are identical, the fourth semiconductor chips can be mirror image chips of the third semiconductor chips and the arrays in the third and fourth substrates (300, 400) are identical. Further, the thickness of the fourth substrate 400 can be substantially the same as the thickness of the third substrate 300 in order to maximize the cancellation of intrinsic substrate bows between the third substrate 300 and the fourth substrate 400. In these embodiments, the structure of the fourth substrate 400 at this stage can be a mirror image structure of the third substrate 300 at this stage. Consequently, the intrinsic substrate bow in the second substrate 200 has a mirror image pattern of the intrinsic substrate bow in the first substrate 100, and the intrinsic substrate bow in the fourth substrate 400 has a mirror image pattern of the intrinsic substrate bow in the third substrate 300. Thus, the two sets of intrinsic substrate bows generated from above the interface between the first and second substrates (100, 200) and from below the interface between the first and second substrates (100, 200) cancel each other so that the net substrate bow of the assembly of the first, second, third, and fourth substrates (100, 200, 300, 400) is zero. In these embodiments, the sub-structure above the interface between the first and second substrates (100, 200) can be a mirror image structure of the sub-structure below the interface between the first and second substrates (100, 200).

Figure 10:
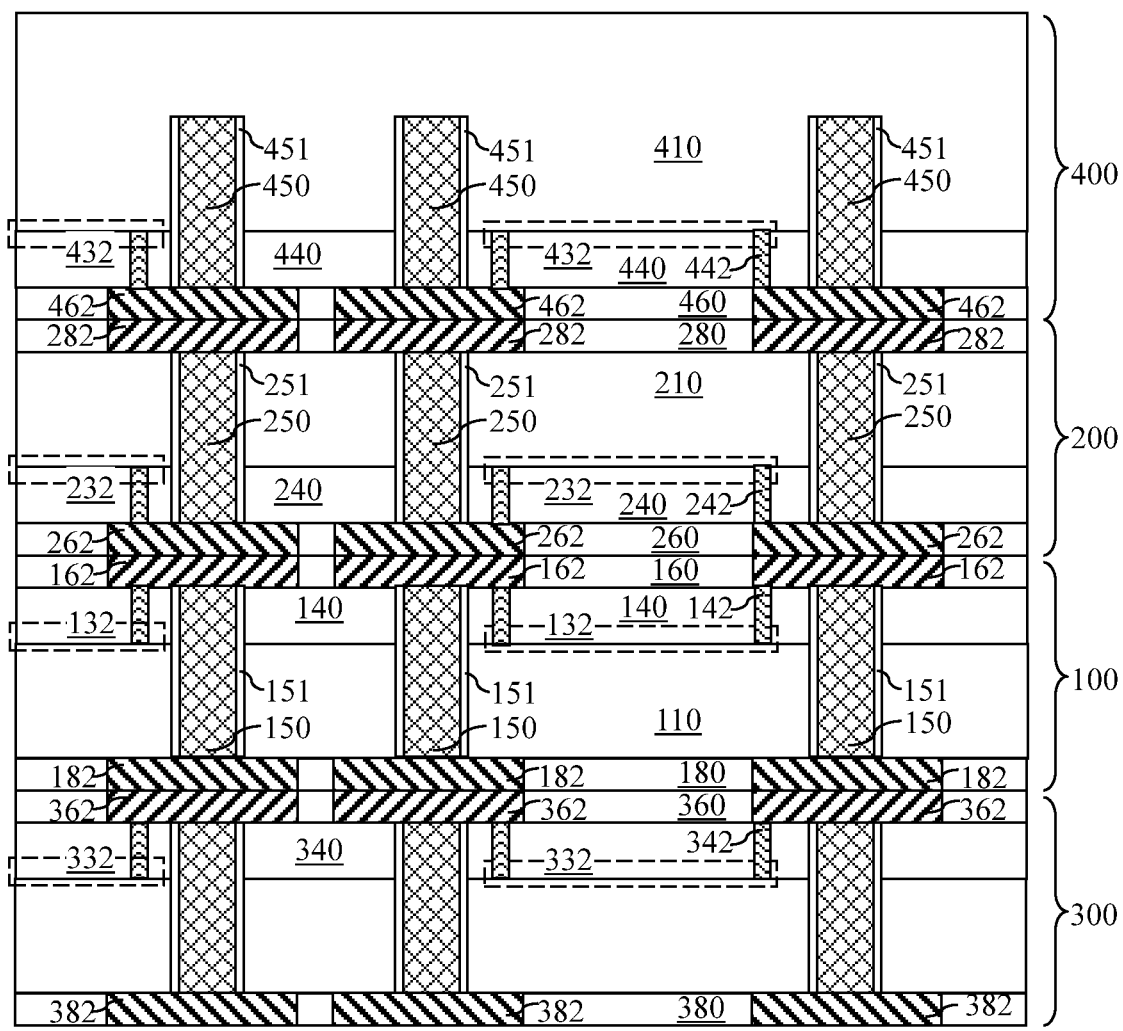

Referring to FIG. 10, the third substrate 300 is thinned employing the fourth substrate 400 as a handle substrate for providing mechanical support. For example, the back side of the third substrate 300, which is the lower side of the assembly of substrates (100, 200, 300, 400), is removed by grinding, chemical mechanical planarization (CMP), a recess etch, or a combination thereof. The bottom surfaces, which are the uppermost surfaces as positioned upside down, of the third conductive TSV structures 350 are exposed. The remaining portions of the third dielectric TSV liner 351 become dielectric cylindrical structures that are topologically homeomorphic to a torus.

Subsequently, a third back side dielectric layer 380 is formed on the back side of the third substrate 300, which is the bottommost surface of the assembly of substrates (100, 200, 300, 400). The third back side dielectric layer 380 can be formed directly on the end surfaces of the third conductive TSV structures 350. The third back side dielectric layer 380 is composed of a dielectric material such as silicon oxide, silicon nitride, silicon oxynitride, or a combination thereof. The third back side bonding pads 382 are formed in the third back side dielectric layer 380 such that each of the third back side bonding pads 382 is electrically connected to one of the third conductive TSV structures 350. The third back side bonding pads 382 are embedded in the third back side dielectric layer 380. The thickness of the third back side dielectric layer 380 can be from 0.2 micron to 10 microns, although lesser and greater thicknesses can also be employed. The thickness of the third substrate 300 after formation of the third back side dielectric layer 380 and the third back side bonding pads 382 can be from 20 microns to 200 microns, although lesser and greater thicknesses can also be employed. The third back side bonding pads 382 are arranged in the mirror image pattern (as observed from below toward the exposed surfaces of the third back side bonding pads 382), which is the pattern of the second front side bonding pads 262 embedded in the second front side dielectric layer 260.

In some embodiments, the structure of the third substrate 300 at this stage (as thinned) can be a mirror image structure of a lower portion of the fourth substrate 400 at this stage (as not yet thinned). Despite the cancellation of intrinsic substrate bow across the first and second substrates (100, 200) and across the third substrate 300 and the lower portion of the fourth substrate 400, an upper portion of the fourth substrate 400 is not matched by a corresponding structure below the interface between the first substrate 100 and the second substrate 200. The difference in the thicknesses of the third substrate 300 and the fourth substrate 400 can be the source of any non-zero contribution to total substrate bow in the assembly of the first, second, third, and fourth substrates (100, 200, 300, 400) at this step.

The processing step described in FIG. 10 is the beginning of the repetitive application of the processing steps of FIGS. 4-9. In general, the processing steps described in FIGS. 4-9 can be repeatedly performed to stack additional substrates while minimizing the total substrate bow of the assembly of the substrates. These processing steps include, for every integer i greater than 2 and up to an integer N that is at least equal to 4, forming (i−2)-th back side bonding pads on a back surface of the (i−2)-th substrate and bonding an i-th substrate having i-th front side bonding pads on a top surface thereof with the (i−2)-th substrate, wherein the i-th front side bonding pads are bonded to the (i−2)-th back side bonding pads, the i-th back side bonding pads are arranged in the image pattern if i is an odd number and in the mirror primary pattern if i is an even number, and the i-th front side bonding pads are arranged in the primary pattern if i is an odd number and in the mirror image pattern if i is an even number.

By inducing cancellation of incremental wafer bow B through matching of mirror image structures across the interface between the first substrate 100 and the second substrate, the total bow of the assembly of multiple substrates is kept at a level of I+B, in which I is the intrinsic bow of a single substrate and B is the incremental wafer bow B that is added when one substrate is bonded to another substrate without counterbalancing by a mirror image substrate on the opposite side. Thus, bonding of multiple substrates is enabled while maintaining the total substrate bow below a level that can be handled by current substrate bonding tools.

In one embodiment, the (i−2)-th back side bonding pads can be electrically shorted to (i−2)-th through-substrate via (TSV) structures located in the (i−2)-th substrate for every integer i greater than 2 and up to the integer N. This feature is described, for example, in FIGS. 5, 8, and 10 and accompanying paragraphs above. In another embodiment, in the absence of some or any conductive TSV structures, some of back side bonding pads may, or may not, by electrically shorted to conductive TSV bonding structures.

The method can include thinning the (i−2)-th substrate by removing a back side portion of the (i−2)-th substrate and exposing an end surface of each of the (i−2)-th TSV structures after bonding a (i−1)-th substrate with the first substrate and prior to bonding the (i−2)-th substrate with the i-th substrate if i is 3. In other words, the method includes thinning the first substrate 100 by removing a back side portion of the first substrate 100 and exposing an end surface of each of the first TSV structures 150 after bonding a second substrate 200 with the first substrate 100 and prior to bonding the first substrate 100 with the third substrate 300. This feature is described, for example, in FIG. 4. If i is greater than 3, the method can further include thinning the (i−2)-th substrate by removing a back side portion of the (i−2)-th substrate and exposing an end surface of each of the (i−2)-th TSV structures after bonding a (i−1)-th substrate with a (i−3)-th substrate and prior to bonding the (i−2)-th substrate with the i-th substrate. This feature is described, for example, in FIGS. 7 and 10 and accompanying paragraphs above.

For every integer i greater than 2, the back side portion of the (i−2)-th substrate is removed by chemical mechanical planarization (CMP), mechanical grinding, dry etching, or a combination thereof. This feature is described, for example, in FIGS. 4, 7, and 10 and accompanying paragraphs above.

In one embodiment, for every positive even integer j that is less than N, a j-th substrate is thinned to a same thickness as a (j−1)-th substrate. This feature is described, for example, in FIG. 7 and accompanying paragraphs above.

In another embodiment, for every positive integer i less than N, each i-th substrate can be thinned to a thickness from 20 microns to 200 microns. This feature is described, for example, in FIGS. 4, 7, and 10 and accompanying paragraphs above.

In yet another embodiment, during the thinning of the (i−2)-th substrate, the (i−1)-th substrate has a same thickness as when the (i−1)-th is bonded with the (i−3)-th substrate if i is greater than 3, or with the first substrate if i is 3, and provides mechanical support. In other words, during the thinning of the first substrate 100, the second substrate 200 has a same thickness (i.e., the initial thickness) as when the second substrate 200 is bonded with the first substrate 100 and provides mechanical support. This feature is described, for example, in FIG. 4. If i is greater than 3, during the thinning of the (i−2)-th substrate, the (i−1)-th substrate has a same thickness as when the (i−1)-th is bonded with the (i−3)-th substrate and provides mechanical support. This feature is described, for example, in FIGS. 7 and 10 and accompanying paragraphs above.

In even another embodiment, each of the i-th front side bonding pads is electrically shorted to an i-th TSV structure for every integer i greater than 2 and up to the integer N. This feature is described, for example, in FIGS. 3, 6, and 9 and accompanying paragraphs above.

In still another embodiment, each i-th substrate includes a semiconductor layer, an interconnect dielectric layer, and at least one semiconductor device located at least at an interface between the semiconductor layer and the interconnect dielectric layer for every integer i greater than 0 and up to the integer N. This feature is described, for example, in FIGS. 3, 6, and 9 and accompanying paragraphs above.

In a further embodiment, at least one metal interconnect structure provides electrical connection between one of the at least one semiconductor device in the i-th substrate and i-th front side bonding pads for every integer i greater than 0 and up to the integer N. This feature is described, for example, in FIGS. 3, 6, and 9 and accompanying paragraphs above.

In a yet further embodiment, each of the (i−2)-th TSV structures includes a conductive material is selected from an elemental metal, an intermetallic alloy, a conductive metal nitride, a doped semiconductor material, and a combination thereof. This feature is described, for example, in FIGS. 3, 6, and 9 and accompanying paragraphs above.

Figure 11:
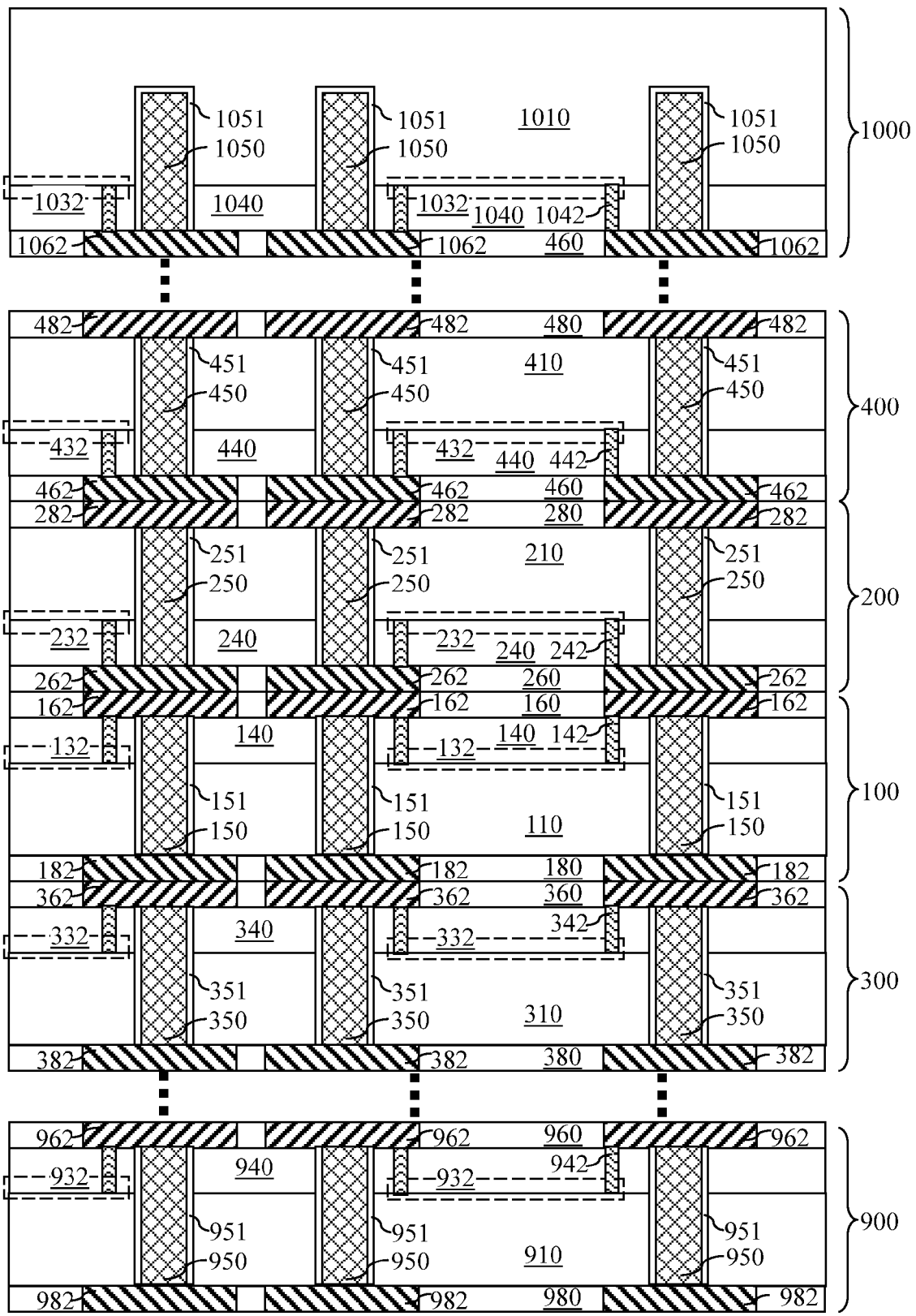

Referring to FIG. 11, the first exemplary structure is built up to form a bonded assembly of a plurality of substrates by employing the methods described above. In the first exemplary structure, the number N of substrates is an even number. The bonded assembly includes, from bottom to top, an (N−1)-th substrate 900, ..., the third substrate 300, the first substrate 100, the second substrate 200, the fourth substrate 400, ..., and the N-th substrate 1000.

Each substrate (100, 200, 300, 400, ..., 900, 1000) includes a semiconductor substrate (110, 210, 310, 410, ..., 910, 1010), which can be a semiconductor-on-insulator (SOI) substrate, a bulk semiconductor substrate, or a hybrid substrate including at least one SOI portion and at least one bulk portion. Each semiconductor substrate (110, 210, 310, 410, ..., 910, 1010) includes a semiconductor material layer that is located at least on the top surface of the semiconductor substrate (110, 210, 310, 410, ..., 910, 1010). The semiconductor material layer can be, for example, a top semiconductor layer of an SOI substrate or a bulk semiconductor layer of a bulk semiconductor substrate. The semiconductor material of the semiconductor material layer may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. The semiconductor material can be polycrystalline or single crystalline, and is preferably single crystalline. For example, each semiconductor material layer may be composed of single crystalline silicon. The thickness of the each substrate other than the N-th substrate 1000 can be from 20 microns to 200 microns, although lesser and greater thicknesses can also be employed.

At least one semiconductor device (132, 232, 332, 432, ..., 932, 1032) is formed on the top surface of each semiconductor substrate (110, 210, 310, 410, ..., 910, 1010). The at least one semiconductor device (132, 232, 332, 432, ..., 932, 1032) can be, for example, a field effect transistor, a bipolar transistor, a thyristor, a varactor, a diode, an electrical fuse, or any other type of semiconductor device known in the art. The side of each semiconductor substrate (110, 210, 310, 410, ..., 910, 1010) including the at least one semiconductor device (132, 232, 332, 432, ..., 932, 1032) is a front side, and the opposite side of the semiconductor substrate (110, 210, 310, 410, ..., 910, 1010) is a back side of the semiconductor substrate (110, 210, 310, 410, ..., 910, 1010).

An interconnect dielectric layer (140, 240, 340, 440, ..., 940, 1040) can be formed over the corresponding at least one semiconductor device (132, 232, 332, 432, ..., 932, 1032) on the front side of each semiconductor substrate (110, 210, 310, 410, ..., 910, 1010). Each interconnect dielectric layer (140, 240, 340, 440, ..., 940, 1040) can be composed of a dielectric material such as silicon oxide, silicon nitride, organosilicate glass (OSG), or any other dielectric material employed for constructing a metal interconnect layer in the art. Each interconnect dielectric layer (140, 240, 340, 440, ..., 940, 1040) can be a single layer of homogeneous dielectric materials, or can be a plurality of layers having different compositions. At least one metal interconnect structure (142, 242, 342, 442, ..., 942, 1042) can be formed in each corresponding interconnect dielectric layer (140, 240, 340, 440, ..., 940, 1040). Each of the at least one first metal interconnect structure (140, 240, 340, 440, ..., 940, 1040) can be a conductive via structure, a conductive line structure, or a combination of at least one conductive via structure and at least one conductive line structure that are electrically connected among one another and electrically connected to one of the corresponding at least one semiconductor device (132, 232, 332, 432, ..., 932, 1032). Each at least one metal interconnect structure (132, 232, 332, 432, ..., 932, 1032) is embedded in the corresponding interconnect dielectric layer (140, 240, 340, 440, ..., 940, 1040). The thickness of each interconnect dielectric layer (140, 240, 340, 440, ..., 940, 1040) can be from 100 nm to 20 microns, although lesser and greater thicknesses can also be employed.

Dielectric through-substrate via (TSV) liners (151, 251, 351, 451, ..., 951, 1051) and conductive though-substrate via (TSV) structures (150, 250, 350, 450, ..., 950, 1050) are located in each corresponding substrate (100, 200, 300, 400, ..., 900, 1000). Each dielectric TSV liner (151, 251, 351, 451, ..., 951, 1051) and each conductive TSV structure (150, 250, 350, 450, ..., 950, 1050) are embedded in the corresponding substrate (100, 200, 300, 400, ..., 900, 1000). The presence of conductive TSV structures and the dielectric TSV liners in the N-th substrate 1000 is optional depending on additional planarization of the N-th substrate 1000 is subsequently performed. In other words, N-th conductive TSV structures 1050 and N-th dielectric TSV liners 1051 may, or may not, be present.

A front side dielectric layer (160, 260, 360, 460, ..., 960, 1060) is located directly on the corresponding interconnect dielectric layer (140, 240, 340, 440, ..., 940, 1040). Each front side dielectric layer (160, 260, 360, 460, ..., 960, 1060) is composed of a dielectric material such as silicon oxide, silicon nitride, silicon oxynitride, or a combination thereof. Front side bonding pads (162, 262, 362, 462, ..., 962, 1062) are formed in the corresponding front side dielectric layer (160, 260, 360, 460, ..., 960, 1060) such that each of the front side bonding pads (162, 262, 362, 462, ..., 962, 1062) is electrically connected to a conductive TSV structure (150, 250, 350, 450, ..., 950, 1050). The front side bonding pads (162, 262, 362, 462, ..., 962, 1062) are composed of a conductive material such as an elemental metal, an intermetallic alloy, a conductive metallic nitride or carbide, or a combination thereof. Further, the front side bonding pads (162, 262, 362, 462, ..., 962, 1062) can be electrically connected to at least one first metal interconnect structure (142, 242, 342, 442, ..., 942, 1042). The first front side bonding pads 162 are embedded in the front side dielectric layer (160, 260, 360, 460, ..., 960, 1060). The thickness of the front side dielectric layer (160, 260, 360, 460, ..., 960, 1060) can be from 0.2 micron to 10 microns, although lesser and greater thicknesses can also be employed. The front side bonding pads (162, 362, ..., 962) for odd-numbered substrates (100, 300, ..., 900) are arranged in the primary pattern (as observed from above), which is the pattern of the first front side bonding pads 162 embedded in the first front side dielectric layer 260 as observed from above. The front side bonding pads (262, 462, ...) for even-numbered substrates (200, 400, ...) are arranged in the mirror image pattern (as observed from below), which is the pattern of the second front side bonding pads 262 embedded in the second front side dielectric layer 260 as observed from below.

A back side dielectric layer (180, 280, 380, 480, ..., 980) is formed on the back side of the first through (N−1)-th substrate (100, 200, 300, 400, ..., 900), respectively. Each back side dielectric layer (180, 280, 380, 480, ..., 980) can be located directly on the end surfaces of the corresponding conductive TSV structures (150, 250, 350, 450, ..., 950). Each back side dielectric layer (180, 280, 380, 480, ..., 980) is composed of a dielectric material such as silicon oxide, silicon nitride, silicon oxynitride, or a combination thereof. Back side bonding pads (182, 282, 382, 482, ..., 982) are formed in the corresponding back side dielectric layer (180, 280, 380, 480, ..., 980) such that each of the back side bonding pads (182, 282, 382, 482, ..., 982) is electrically connected to one of the corresponding conductive TSV structures (150, 250, 350, 450, ..., 950). The back side bonding pads (182, 282, 382, 482, ..., 982) are embedded in the corresponding back side dielectric layer (180, 280, 380, 480, ..., 980). The thickness of each back side dielectric layer (180, 280, 380, 480, ..., 980) can be from 0.2 micron to 10 microns, although lesser and greater thicknesses can also be employed. The thickness of each thinned substrate (100, 200, 300, 400, ..., 900) can be from 20 microns to 200 microns, although lesser and greater thicknesses can also be employed.

The back side bonding pads (182, 382, ..., 982) for odd-numbered substrates (100, 300, ..., 900) are arranged in the mirror-image pattern (as observed from below), which is the pattern of the second front side bonding pads 262 embedded in the second front side dielectric layer 260. The back side bonding pads (282, 482, ...) for even-numbered substrates (200, 400, ...) are arranged in the primary pattern (as observed from above), which is the pattern of the first front side bonding pads 162 embedded in the first front side dielectric layer 160. In a vertical direction in a see-through view, all front side bonding pads (162, 262, 362, 462, ..., 962, 1062) and all back side bonding pads (182, 282, 382, 482, ..., 982) are arranged in the same pattern.

In one embodiment, a first sub-structure including all substrates below the interface between the first substrate 100 and the second substrate 200 and excluding the (N−1)-th substrate 900 is a mirror image structure of a second sub-structure including all substrates above the interface between the first substrate 100 and the second substrate 200 and excluding the N-th substrate 1000. In another embodiment, a first collection of all bonding pads below the interface between the first substrate 100 and the second substrate 200 excluding the back side bonding pads 982 of the (N−1)-th substrate 900 is a mirror image of a second collection of all bonding pads above the interface between the first substrate 100 and the second substrate 200. In yet another embodiment, a first downward thickness distribution of all substrates below the interface between the first substrate 100 and the second substrate 200 excluding the thickness of the (N−1)-th substrate 900 is identical with a second upward thickness distribution of all substrates above the interface between the first substrate 100 and the second substrate 200 excluding the thickness of the N-th substrate 1000.

The bonded assembly of a plurality of substrates in the first exemplary structure includes the first substrate 100 bonded to the second substrate 200 and an i-th semiconductor substrate for every integer i greater than 2 and up to an integer N that is at least equal to 4, i.e., the third substrate 300, ..., and the N-th substrate 1000. The first substrate 200 has first front side bonding pads 162 located on a front surface thereof and the second substrate 200 has second front side bonding pads 262 located on a front surface thereof. The first front side bonding pads 162 are arranged in a primary pattern, the second front side bonding pads 262 are arranged in a mirror image pattern that is a pattern of a mirror image of the primary pattern. The first front side bonding pads 162 are bonded to the second front side bonding pads 262. For every integer i greater than 2 and up to an integer N that is at least equal to 4, the (i−2)-th substrate (i−2)00 includes (i−2)-th back side bonding pads (i−2)82 located on a back surface thereof, the i-th substrate i00 includes i-th front side bonding pads i62 located on a top surface thereof and bonded with the (i−2)-th substrate (i−2)00. For every integer i greater than 2 and up to an integer N that is at least equal to 4, the i-th front side bonding pads i62 are bonded to the (i−2)-th back side bonding pads (i−2)82. For every integer i greater than 2 and up to an integer N that is at least equal to 4, the i-th back side bonding pads i82 are arranged in the mirror image pattern if i is an odd number and in the primary pattern if i is an even number, and the i-th front side bonding pads i62 are arranged in the primary pattern if i is an odd number and in the mirror image pattern if i is an even number.

In one embodiment, the (i−2)-th back side bonding pads (i−2)82 are electrically shorted to (i−2)-th through-substrate via (TSV) structures (i−2)50 located in the (i−2)-th substrate (i−2)00 for every integer i greater than 2 and up to the integer N.

In another embodiment, each j-th substrate j00 is a mirror image substrate of a 0-1)-th substrate (j−1)00 for every positive even integer j that is less than N.

In yet another embodiment, the primary pattern has built-in mirror symmetry and the primary pattern and the mirror image pattern are identical.

Figure 12:
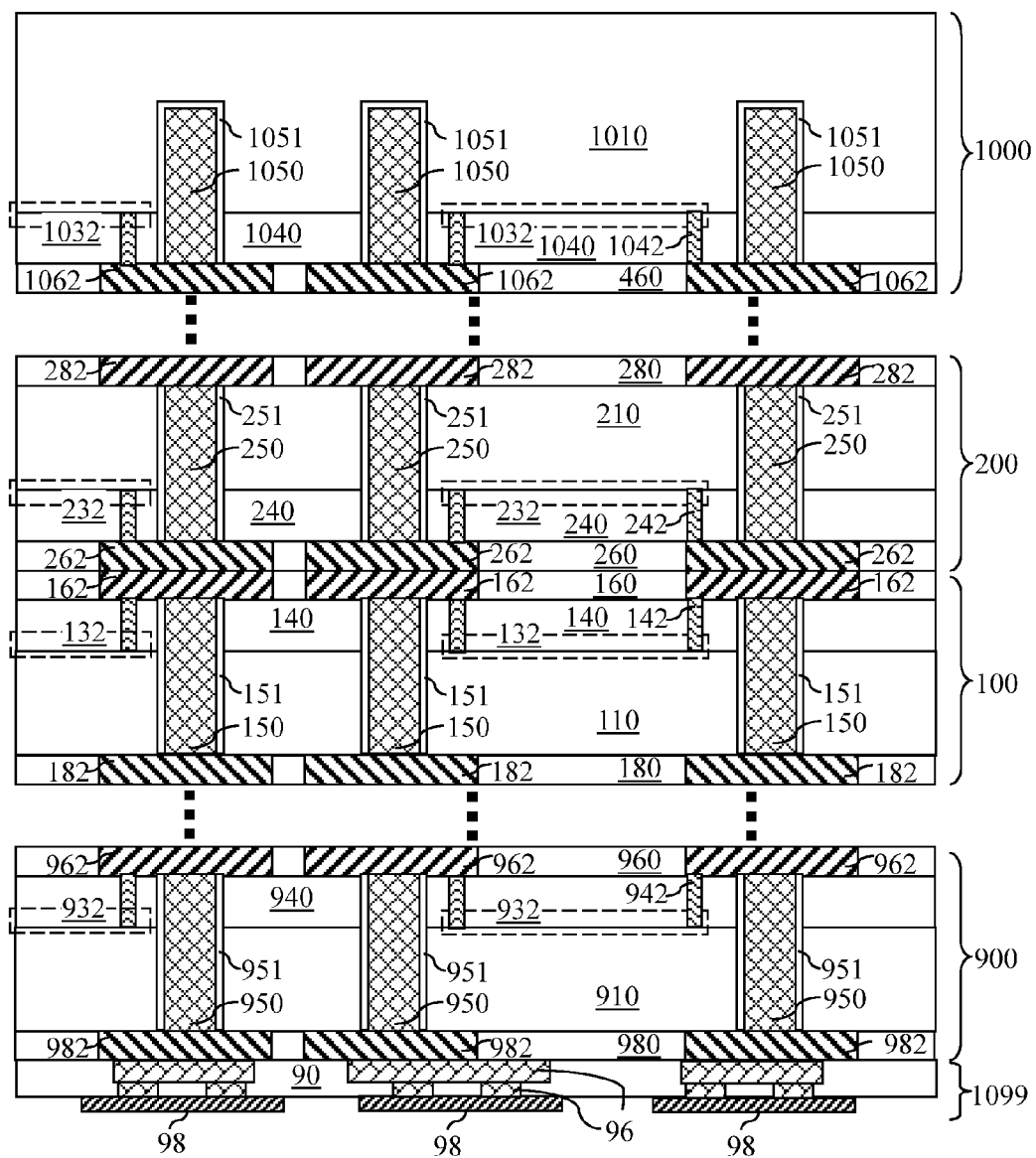

Referring to FIG. 12, (N−1)-th back side bonding pads 982 are located on the back surface of the (N−1)-th substrate 900. Because N is an even number in the first exemplary structure, (N−1) is an odd number. In this case, the (N−1)-th back side bonding pads 982 are arranged in the mirror image pattern as observed from below. A C4-level dielectric layer 90 is formed on the (N−1)-th back side bonding pads 982 and the (N−1)-th back side dielectric layer 980. The C4-level dielectric layer 90 is composed of a dielectric material such as silicon oxide, silicon nitride, silicon oxynitride, or a combination thereof. The thickness of the C4-level dielectric layer 90 can be from 500 nm to 5 microns, although lesser and greater thicknesses can also be employed. Optionally, C4-level metal interconnect structures 96 can be formed as embedded structures in the C4-level dielectric layer 90.

Subsequently, C4 bonding pads 98 can be formed directly on the (N−1)-th back side bonding pads 982 if C4-level metal interconnect structures 96 are not present, or directly on the C4-level metal interconnect structures 96 if the C4-level metal interconnect structures 96 are present.

In one embodiment, each of the i-th substrate i00 includes semiconductor memory chips selected from static random access memory (SRAM) chips, dynamic random access memory (DRAM) chips, and combination chips including SRAM and DRAM components for each positive i up to N.

In another embodiment, each of the i-th substrate i00 includes semiconductor memory chips selected from static random access memory (SRAM) chips, dynamic random access memory (DRAM) chips, and combination chips including SRAM and DRAM components for each positive i up to N−1, and the N-th substrate 1000 includes a processor chip.

Figure 13:
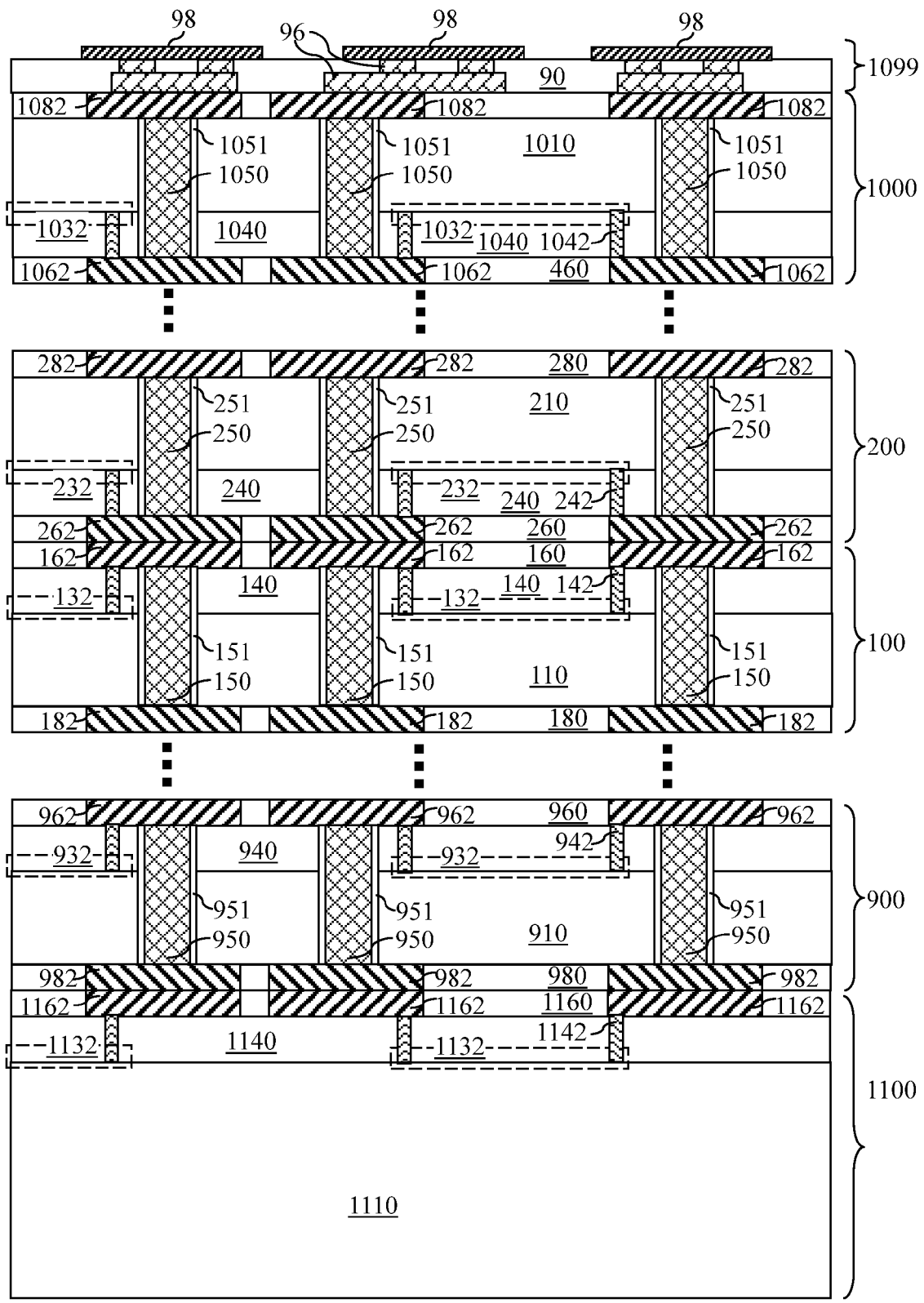
FIG. 13 is a vertical cross-sectional view of a second exemplary structure along a vertical plane corresponding to the Y-Y' plane in FIGS. 1A and 1B or the Y-Y' plane in FIGS. 2A and 2B according to a second embodiment of the present invention.

Referring to FIG. 13, a second exemplary structure is built up to form another bonded assembly of a plurality of substrates by employing the methods described above. In the second exemplary structure, the number N of substrates is an odd number. The bonded assembly includes, from bottom to top, an N-th substrate 1100, (N−2)-th substrate 900, . . . , the third substrate 300, the first substrate 100, the second substrate 200, the fourth substrate 400, . . . , and the (N−1)-th substrate 1000. The N-th substrate 1100 includes an N-th semiconductor substrate 1110 including a semiconductor material layer, on which at least one N-th semiconductor device 1132 is located. The N-th substrate 1100 also includes an N-th interconnect dielectric layer 1140, at least one N-th metal interconnect structure 1162 embedded therein, an N-th front side dielectric layer 1160, and N-th front side bonding pads 1162 embedded therein.

Because N is an odd number in the second exemplary structure, (N−1) is an even number. In this case, the (N−1)-th back side bonding pads 1082 are arranged in the primary pattern as observed from above. A C4-level dielectric layer 90 is formed on the (N−1)-th back side bonding pads 1082 and the (N−1)-th back side dielectric layer 1080. The C4-level dielectric layer 90 is composed of a dielectric material such as silicon oxide, silicon nitride, silicon oxynitride, or a combination thereof. The thickness of the C4-level dielectric layer 90 can be from 500 nm to 5 microns, although lesser and greater thicknesses can also be employed. Optionally, C4-level metal interconnect structures 96 can be formed as embedded structures in the C4-level dielectric layer 90.

Subsequently, C4 bonding pads 98 can be formed directly on the (N−1)-th back side bonding pads 1082 if C4-level metal interconnect structures 96 are not present, or directly on the C4-level metal interconnect structures 96 if the C4-level metal interconnect structures 96 are present.

In one embodiment, each of the i-th substrate i00 includes semiconductor memory chips selected from static random access memory (SRAM) chips, dynamic random access memory (DRAM) chips, and combination chips including SRAM and DRAM components for each positive i up to N.

In another embodiment, each of the i-th substrate i00 includes semiconductor memory chips selected from static random access memory (SRAM) chips, dynamic random access memory (DRAM) chips, and combination chips including SRAM and DRAM components for each positive i up to N−1, and the N-th substrate 1100 includes a processor chip.

While the invention has been described in terms of specific embodiments, it is evident in view of the foregoing description that numerous alternatives, modifications and variations will be apparent to those skilled in the art, Accordingly, the invention is intended to encompass all such alternatives, modifications and variations which fall within the scope and spirit of the invention and the following claims. For example, three or more chips could be stacked using this invention and/or through silicon vias could be used to connect the chips.

What is claimed is:

1. A method of forming a semiconductor structure comprising:

bonding a first substrate having first front side bonding pads on a front surface thereof with a second substrate having second front side bonding pads on a front surface thereof, wherein said first front side bonding pads are arranged in a primary pattern, and said second front side bonding pads are arranged in a minor image pattern that is a pattern of a minor image of said primary pattern;

performing a first series of steps including:
physically exposing surfaces of conductive through substrate vias (TSV's) embedded within said first substrate by planarizing a back side portion of said first substrate after said first substrate is bonded to said second substrate,
forming a first back side dielectric layer on said first substrate after said planarizing,
forming first back side bonding pads within said first back side dielectric layer and directly on said TSV's within said first substrate, and
bonding a third substrate having third front side bonding pads on a top surface thereof with said first substrate, wherein said third front side bonding pads are bonded to said first back side bonding pads, said third back side bonding pads are arranged in said minor image pattern, and said third front side bonding pads are arranged in said primary pattern; and performing a second series of steps including:
physically exposing surfaces of conductive through substrate vias (TSV's) embedded within said second substrate by planarizing a back side portion of said second substrate after said second substrate is bonded to at least one of said first substrate and said second substrate directly or indirectly through at least one intervening substrate,
forming a second back side dielectric layer on said second substrate after said planarizing,
forming second back side bonding pads within said second back side dielectric layer and directly on said TSV's within said second substrate, and bonding a fourth substrate having fourth front side bonding pads on a top surface thereof with said second substrate, wherein said fourth front side bonding pads are bonded to said second back side bonding pads, said fourth back side bonding pads are arranged in said primary pattern, and said fourth front side bonding pads are arranged in said minor image pattern.

2. The method of claim 1, wherein said first back side bonding pads are electrically shorted to first through-substrate via (TSV) structures located in said first substrate, and said second back side bonding pads are electrically shorted to second TSV structures located in said second substrate.

3. The method of claim 2, further comprising:
thinning said first substrate by removing a back side portion of said first substrate and exposing an end surface of each of said first TSV structures after bonding said second substrate with said first substrate, and prior to bonding said first substrate with said third substrate; and
thinning said second substrate by removing a back side portion of said second substrate and exposing an end surface of each of said second TSV structures after bonding said third substrate with said first substrate, and prior to bonding said second substrate with said fourth substrate.

4. The method of claim 3, wherein said back side portion of said first substrate and said back side portion of said second substrate are removed by chemical mechanical planarization (CMP), mechanical grinding, dry etching, or a combination thereof.

5. The method of claim 3, wherein said second substrate is thinned to a same thickness as said first substrate.

6. The method of claim 3, wherein each of said first, second, and third substrates is thinned to a thickness from 20 microns to 200 microns.

7. The method of claim 3, wherein during thinning of said second substrate, said third substrate has a same thickness as when said third substrate becomes bonded with said first substrate, and provides mechanical support during said thinning of said second substrate.

8. The method of claim 2, wherein each of said third front side bonding pads is electrically shorted to a third TSV structure, and each of said fourth front side bonding pads is electrically shorted to a fourth TSV structure.

9. The method of claim 2, wherein each of said first, second, third, and fourth substrates includes a semiconductor layer, an interconnect dielectric layer, and at least one semiconductor device located at least at an interface between said semiconductor layer and said interconnect dielectric layer.

10. The method of claim 9, wherein at least one first metal interconnect structure provides electrical connection between a first semiconductor device in said first substrate and said first front side bonding pads, at least one second metal interconnect structure provides electrical connection between a second semiconductor device in said second substrate and said second front side bonding pads, at least one third metal interconnect structure provides electrical connection between a third semiconductor device in said third substrate and said third front side bonding pads, and at least one fourth metal interconnect structure provides electrical connection between a fourth semiconductor device in said fourth substrate and said fourth front side bonding pads.

11. The method of claim 2, wherein each of said first and second TSV structures comprises a conductive material is selected from an elemental metal, an intermetallic alloy, a conductive metal nitride, a doped semiconductor material, and a combination thereof.

12. The method of claim 1, further comprising forming C4 bonding pads on a structure selected from said third back side bonding pads, said fourth back side bonding pads, and back side bonding pads of another substrate that is bonded, directly or through intermediate substrates, to said third substrate or said fourth substrate.

13. The method of claim 1, wherein each of said first, second, third, and fourth substrates includes semiconductor memory chips selected from static random access memory (SRAM) chips, dynamic random access memory (DRAM) chips, and combination chips including SRAM and DRAM components.

14. The method of claim 1, wherein each of said first, second, and third substrates includes semiconductor memory chips selected from static random access memory (SRAM) chips, dynamic random access memory (DRAM) chips, and combination chips including SRAM and DRAM components, and said method further comprises bonding a semiconductor substrate including a processor chip to said third or fourth substrate directly or through at least one intermediate substrate.

15. The method of claim 1, wherein each of said first substrate and said third substrate is a mirror image substrate of said second substrate.

16. The method of claim 1, wherein said primary pattern has built-in mirror symmetry and said primary pattern and said mirror image pattern are identical.

17. A bonded assembly of a plurality of substrates comprising:
a first substrate bonded to a second substrate, wherein said first substrate has first front side bonding pads located on a front surface thereof and said second substrate has second front side bonding pads located on a front surface thereof, wherein said first front side bonding pads are arranged in a primary pattern, said second front side bonding pads are arranged in a minor image pattern that is a pattern of a mirror image of said primary pattern, and said first front side bonding pads are bonded to said second front side bonding pads; and
a third substrate and a fourth substrate,
wherein said first substrate includes first back side bonding pads located on a back surface thereof and a first back side dielectric layer embedding said first back side bonding pads and having a topmost surface that is coplanar with topmost surfaces of said first back side bonding pads and having a bottommost surface that is coplanar with bottommost surfaces of said first back side bonding pads,
wherein said third substrate includes third front side bonding pads located on a top surface thereof and a third front side dielectric layer embedding third front side bonding pads and having a topmost surface that is coplanar with topmost surfaces of said third front side bonding pads and having a bottommost surface that is coplanar with bottommost surfaces of said i-th front side bonding pads and bonded with said first substrate,
wherein said third front side bonding pads are bonded to said first back side bonding pads, and
wherein said third back side bonding pads are arranged in said mirror image pattern, and said third front side bonding pads are arranged in said primary pattern and wherein said second substrate includes second back side bonding pads located on a back surface thereof and a second back side dielectric layer embedding said second back side bonding pads and having a topmost surface that is coplanar with topmost surfaces of said second back side bonding pads and having a bottommost surface that is coplanar with bottommost surfaces of said second back side bonding pads, wherein said fourth substrate includes fourth front side bonding pads located on a top surface thereof and a fourth front side dielectric layer embedding fourth front side bonding pads and having a topmost surface that is coplanar with topmost surfaces of said fourth front side bonding pads and having a bottommost surface that is coplanar with bottommost surfaces of said fourth front side bonding pads and bonded with said second substrate, wherein said fourth front side bonding pads are bonded to said second back side bonding pads, and wherein said fourth back side bonding pads are arranged in said primary pattern, and said fourth front side bonding pads are arranged in said mirror image pattern, and wherein each of said first, second, third, and fourth substrates includes a semiconductor layer, an interconnect dielectric layer, and at least one semiconductor device located at least at an interface between said semiconductor layer and said interconnect dielectric layer.

18. The bonded assembly of claim 17, wherein said first back side bonding pads are electrically shorted to first through-substrate via (TSV) structures located in said first substrate, and said second back side bonding pads are electrically shorted to second TSV structures located in said second substrate.

19. The bonded assembly of claim 18, wherein each of said first and second TSV structures comprises a conductive material is selected from an elemental metal, an intermetallic alloy, a conductive metal nitride, a doped semiconductor material, and a combination thereof.

20. The bonded assembly of claim 17, wherein at least one first metal interconnect structure provides electrical connection between a first semiconductor device in said first substrate and said first front side bonding pads, at least one second metal interconnect structure provides electrical connection between a second semiconductor device in said second substrate and said second front side bonding pads, at least one third metal interconnect structure provides electrical connection between a third semiconductor device in said third substrate and said third front side bonding pads, and at least one fourth metal interconnect structure provides electrical connection between a fourth semiconductor device in said fourth substrate and said fourth front side bonding pads.

21. The bonded assembly of claim 17, further comprising C4 bonding pads located on a structure selected from said third back side bonding pads, said fourth back side bonding pads, and back side bonding pads of another substrate that is bonded, directly or through intermediate substrates, to said third substrate or said fourth substrate.

22. A bonded assembly of a plurality of substrates comprising:
a first substrate bonded to a second substrate, wherein said first substrate has first front side bonding pads located on a front surface thereof and said second substrate has second front side bonding pads located on a front surface thereof, wherein said first front side bonding pads are arranged in a primary pattern, said second front side bonding pads are arranged in a minor image pattern that is a pattern of a mirror image of said primary pattern, and said first front side bonding pads are bonded to said second front side bonding pads; and
a third substrate and a fourth substrate,
wherein said first substrate includes first back side bonding pads located on a back surface thereof and a first back side dielectric layer embedding said first back side bonding pads and having a topmost surface that is coplanar with topmost surfaces of said first back side bonding pads and having a bottommost surface that is coplanar with bottommost surfaces of said first back side bonding pads, wherein said third substrate includes third front side bonding pads located on a top surface thereof and a third front side dielectric layer embedding third front side bonding pads and having a topmost surface that is coplanar with topmost surfaces of said third front side bonding pads and having a bottommost surface that is coplanar with bottommost surfaces of said i-th front side bonding pads and bonded with said first substrate, wherein said third front side bonding pads are bonded to said first back side bonding pads, and wherein said third back side bonding pads are arranged in said mirror image pattern, and said third front side bonding pads are arranged in said primary pattern and wherein said second substrate includes second back side bonding pads located on a back surface thereof and a second back side dielectric layer embedding said second back side bonding pads and having a topmost surface that is coplanar with topmost surfaces of said second back side bonding pads and having a bottommost surface that is coplanar with bottommost surfaces of said second back side bonding pads, wherein said fourth substrate includes fourth front side bonding pads located on a top surface thereof and a fourth front side dielectric layer embedding fourth front side bonding pads and having a topmost surface that is coplanar with topmost surfaces of said fourth front side bonding pads and having a bottommost surface that is coplanar with bottommost surfaces of said fourth front side bonding pads and bonded with said second substrate, wherein said fourth front side bonding pads are bonded to said second back side bonding pads, and wherein said fourth back side bonding pads are arranged in said primary pattern, and said fourth front side bonding pads are arranged in said mirror image pattern, wherein each of said first, second, third, and fourth substrates includes semiconductor memory chips selected from static random access memory (SRAM) chips, dynamic random access memory (DRAM) chips, and combination chips including SRAM and DRAM components.

23. A bonded assembly of a plurality of substrates comprising:
a first substrate bonded to a second substrate, wherein said first substrate has first front side bonding pads located on a front surface thereof and said second substrate has second front side bonding pads located on a front surface thereof, wherein said first front side bonding pads are arranged in a primary pattern, said second front side bonding pads are arranged in a minor image pattern that is a pattern of a mirror image of said primary pattern, and said first front side bonding pads are bonded to said second front side bonding pads; and
a third substrate and a fourth substrate,
wherein said first substrate includes first back side bonding pads located on a back surface thereof and a first back side dielectric layer embedding said first back side bonding pads and having a topmost surface that is coplanar with topmost surfaces of said first back side bonding pads and having a bottommost surface that is coplanar with bottommost surfaces of said first back side bonding pads, wherein said third substrate includes third front side bonding pads located on a top surface thereof and a third front side dielectric layer embedding third front side bonding pads and having a topmost surface that is coplanar with topmost surfaces of said third front side bonding pads and having a bottommost surface that is coplanar with bottommost surfaces of said i-th front side bonding pads and bonded with said first substrate, wherein said third front side bonding pads are bonded to said first back side bonding pads, and wherein said third back side bonding pads are arranged in said mirror image pattern, and said third front side bonding pads are arranged in said primary pattern and wherein said second substrate includes second back side bonding pads located on a back surface thereof and a second back side dielectric layer embedding said second back side bonding pads and having a topmost surface that is coplanar with topmost surfaces of said second back side bonding pads and having a bottommost surface that is coplanar with bottommost surfaces of said second back side bonding pads, wherein said fourth substrate includes fourth front side bonding pads located on a top surface thereof and a fourth front side dielectric layer embedding fourth front side bonding pads and having a topmost surface that is coplanar with topmost surfaces of said fourth front side bonding pads and having a bottommost surface that is coplanar with bottommost surfaces of said fourth front side bonding pads and bonded with said second substrate, wherein said fourth front side bonding pads are bonded to said second back side bonding pads, and wherein said fourth back side bonding pads are arranged in said primary pattern, and said fourth front side bonding pads are arranged in said mirror image pattern, wherein each of said first, second, and third substrates includes semiconductor memory chips selected from static random access memory (SRAM) chips, dynamic random access memory (DRAM) chips, and combination chips including SRAM and DRAM components, and said method further comprises boning a semiconductor substrate including a processor chip to said third or fourth substrate directly or through at least one intermediate substrate.

24. The semiconductor structure of claim 17, wherein said primary pattern has built-in mirror symmetry and said primary pattern and said minor image pattern are identical.

* * * * *